US011069849B2

(12) United States Patent
Brink et al.

(10) Patent No.: US 11,069,849 B2
(45) Date of Patent: Jul. 20, 2021

(54) SHADOW MASK SIDEWALL TUNNEL JUNCTION FOR QUANTUM COMPUTING

(71) Applicant: International Business Machines Corporation, Armonk, NY (US)

(72) Inventors: Markus Brink, White Plains, NY (US); Sami Rosenblatt, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/908,951

(22) Filed: Jun. 23, 2020

(65) Prior Publication Data

US 2020/0321509 A1 Oct. 8, 2020

Related U.S. Application Data

(60) Division of application No. 16/413,850, filed on May 16, 2019, now Pat. No. 10,790,433, which is a
(Continued)

(51) Int. Cl.
    H01L 39/22 (2006.01)
    H01L 39/24 (2006.01)
    H01L 39/02 (2006.01)
    H01L 39/12 (2006.01)
    G06N 10/00 (2019.01)

(52) U.S. Cl.
    CPC .......... H01L 39/223 (2013.01); G06N 10/00 (2019.01); H01L 39/025 (2013.01); H01L 39/12 (2013.01); H01L 39/2493 (2013.01); H01L 39/2406 (2013.01)

(58) Field of Classification Search
    None
    See application file for complete search history.

(56) References Cited

U.S. PATENT DOCUMENTS 4,299,679 A 11/1981 Suzuki
4,370,359 A 1/1983 Fetter et al.
(Continued)

FOREIGN PATENT DOCUMENTS

CN 102437281 A 5/2012
CN 104701451 A 6/2015

OTHER PUBLICATIONS

Costache et al. "Lateral metallic devices made by a multiangle shadow evaporation technique." J. Vac. Sci. Technol. B, 30(4), Jul./Aug. 2012, pp. 1-5.
(Continued)

*Primary Examiner* — Khaja Ahmad
(74) *Attorney, Agent, or Firm* — Cantor Colburn LLP; Douglas Pearson

(57) ABSTRACT

A technique relates to forming a sidewall tunnel junction. A first conducting layer is formed using a first shadow mask evaporation. A second conducting layer is formed on a portion of the first conducting layer, where the second conducting layer is formed using a second shadow mask evaporation. An oxide layer is formed on the first conducting layer and the second conducting layer. A third conducting layer is formed on part of the oxide layer, such that the sidewall tunnel junction is positioned between the first conducting layer and the third conducting layer.

15 Claims, 32 Drawing Sheets

Related U.S. Application Data continuation of application No. 15/616,193, filed on Jun. 7, 2017, now Pat. No. 10,367,134.

(56) References Cited

U.S. PATENT DOCUMENTS

| | | | |
|---|---|---|---|
| 4,412,902 A | | 11/1983 | Michikami et al. |
| 4,430,662 A | | 2/1984 | Jillie, Jr. et al. |
| 5,313,074 A | | 5/1994 | Tamura et al. |
| 5,401,530 A | | 3/1995 | Tamura et al. |
| 5,488,030 A | * | 1/1996 | Tanaka .............. H01L 39/225 257/33 |
| 5,750,474 A | * | 5/1998 | Sung ................ H01L 39/223 505/329 |
| 5,801,393 A | * | 9/1998 | Sung ................ H01L 39/223 257/32 |
| 5,821,557 A | | 10/1998 | Nagamachi et al. |
| 5,854,493 A | | 12/1998 | Nakamura et al. |
| 5,892,243 A | | 4/1999 | Chan |
| 5,916,848 A | | 6/1999 | Durand |
| 5,939,730 A | | 8/1999 | Durand et al. |
| 5,945,383 A | * | 8/1999 | Hunt ................ H01L 39/2496 505/329 |
| 6,004,907 A | * | 12/1999 | Suh ................. H01L 39/2496 505/329 |
| 6,188,919 B1 | * | 2/2001 | LaGraff ............ H01L 39/2496 257/31 |
| 6,790,675 B2 | | 9/2004 | Adachi et al. |
| 7,015,499 B1 | | 3/2006 | Zagoskin et al. |
| 7,091,515 B2 | | 8/2006 | Horibe |
| 7,446,372 B2 | | 11/2008 | Forbes |
| 8,437,818 B1 | | 5/2013 | Tolpygo et al. |
| 9,136,457 B2 | | 9/2015 | Tolpygo |
| 9,455,391 B1 | | 9/2016 | Nayfeh et al. |
| 10,361,354 B2 | | 7/2019 | Brink et al. |
| 10,367,134 B2 | | 7/2019 | Brink et al. |
| 2002/0074544 A1 | * | 6/2002 | Sung ................ H01L 39/2496 257/31 |
| 2003/0042481 A1 | | 3/2003 | Tzalenchuk et al. |
| 2004/0155237 A1 | | 8/2004 | Kerber |
| 2007/0076477 A1 | | 4/2007 | Hwang et al. |
| 2008/0070325 A1 | | 3/2008 | Tolpygo |
| 2010/0207622 A1 | | 8/2010 | Finkler et al. |
| 2014/0054552 A1 | | 2/2014 | Tolpygo et al. |
| 2015/0118604 A1 | | 4/2015 | Dynes et al. |
| 2015/0119252 A1 | | 4/2015 | Ladizinsky et al. |
| 2016/0093790 A1 | * | 3/2016 | Rigetti ............. H01L 39/2493 257/31 |
| 2016/0204274 A1 | | 7/2016 | Fan et al. |
| 2017/0084814 A1 | | 3/2017 | Chen et al. |
| 2018/0219150 A1 | * | 8/2018 | Lanting ............. H01L 27/18 |
| 2019/0245132 A1 | | 8/2019 | Brink et al. |
| 2019/0273198 A1 | | 9/2019 | Brink et al. |

OTHER PUBLICATIONS

Dolan, "Offset masks for lift-off photoprocessing." Applied Physics Letters. vol. 31, No. 5, Sep. 1977, pp. 337-339.

International Search Report and Written Opinion of the International Searching Aurhority for PCT/IB2017/058128, dated Apr. 16, 2018, 6 pages.

List of IBM Patents or Patent Applications Treated As Related; (Appendix P); Date Filed: Jun. 23, 2020, 2 pages.

Potts et al. "CMOS compatible fabrication methods for submicron Josephson junction qubits." IEEE Proc-Sci. Meas. Technol., vol. 148, No. 5, Sep. 2001, pp. 225-228.

UK Examination Report for GB1918081.5 dated Jan. 24, 2020, 1 page.

* cited by examiner

FORM A FIRST CONDUCTING LAYER USING A FIRST SHADOW MASK EVAPORATION, THE FIRST CONDUCTING LAYER HAVING A WIDTH DIMENSION GREATER THAN A HEIGHT DIMENSION 2802

FORM A SECOND CONDUCTING LAYER ON TOP OF A PORTION OF THE FIRST CONDUCTING LAYER, THE SECOND CONDUCTING LAYER BEING FORMED USING A SECOND SHADOW MASK EVAPORATION 2804

FORM AN OXIDE LAYER ON THE FIRST CONDUCTING LAYER AND THE SECOND CONDUCTING LAYER, A PART OF THE FIRST CONDUCTING LAYER BEING UNDERNEATH THE SECOND CONDUCTING 2806

FORM A THIRD CONDUCTING LAYER ON PART OF THE OXIDE LAYER, SUCH THAT THE SIDEWALL TUNNEL JUNCTION IS POSITIONED BETWEEN THE SECOND CONDUCTING LAYER AND THE THIRD CONDUCTING LAYER, WHEREIN THE SIDEWALL JUNCTION IS ALSO POSITIONED BETWEEN THE PART OF THE FIRST CONDUCTING LAYER AND THE THIRD CONDUCTING LAYER 2808

FORM A FIRST CONDUCTING LAYER USING A FIRST SHADOW MASK EVAPORATION, THE FIRST CONDUCTING LAYER HAVING A HEIGHT DIMENSION GREATER THAN A WIDTH DIMENSION  2902

↓

FORM AN OXIDE LAYER ON THE FIRST CONDUCTING LAYER  2904

↓

FORMING A SECOND CONDUCTING LAYER ON THE OXIDE LAYER COVERING A TOP PORTION AND A SIDE PORTION OF THE FIRST CONDUCTING LAYER, SUCH THAT THE SIDEWALL TUNNEL JUNCTION IS POSITIONED BETWEEN THE SECOND CONDUCTING LAYER AND THE TOP AND SIDE PORTIONS OF THE FIRST CONDUCTING LAYER, WHEREIN THE SECOND CONDUCTING LAYER IS FORMED USING A SECOND SHADOW MASK EVAPORATION  2906

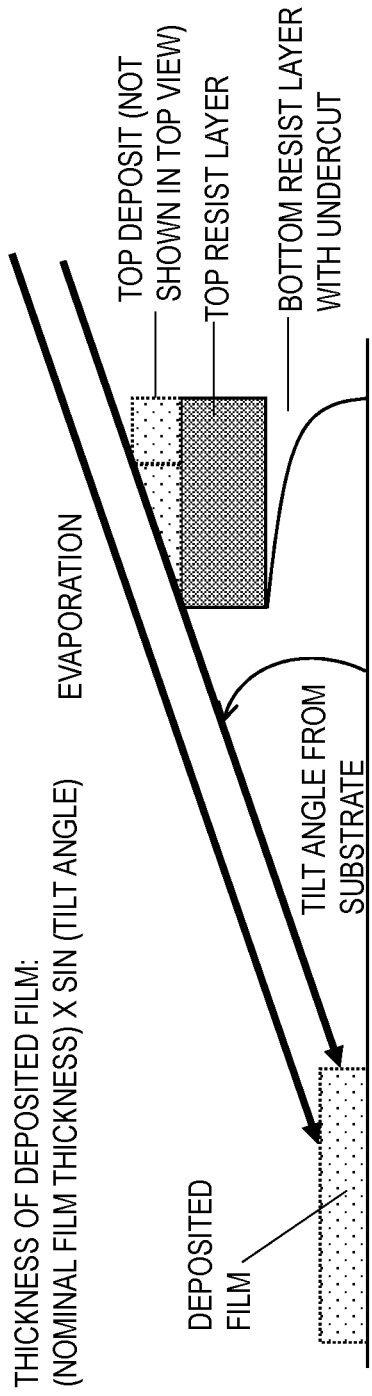
FIG. 31 CROSS-SECTION A
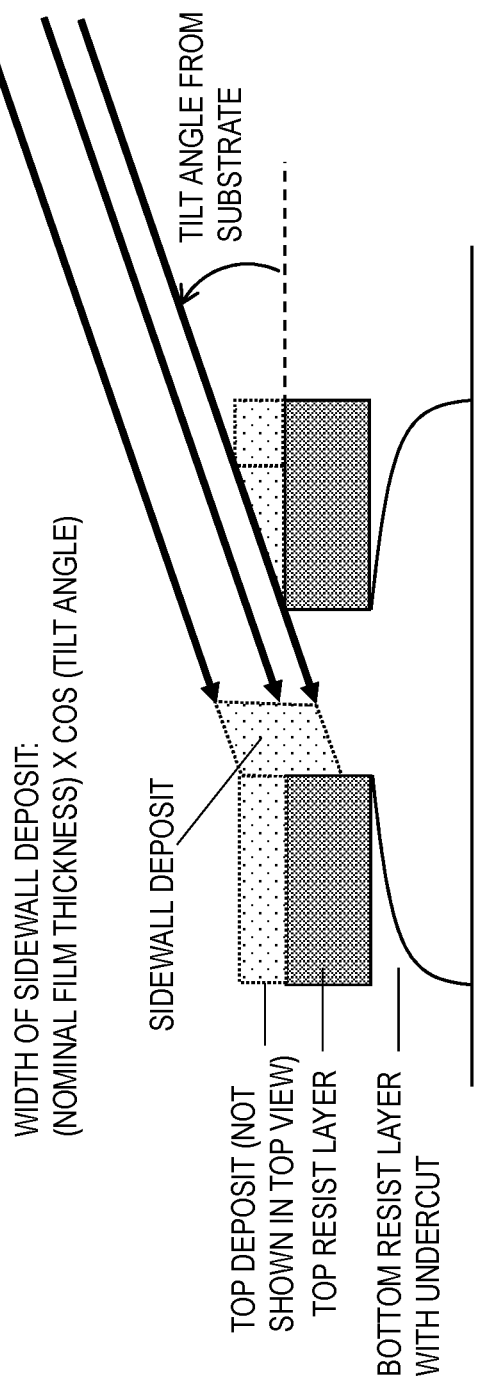
FIG. 32 CROSS-SECTION B

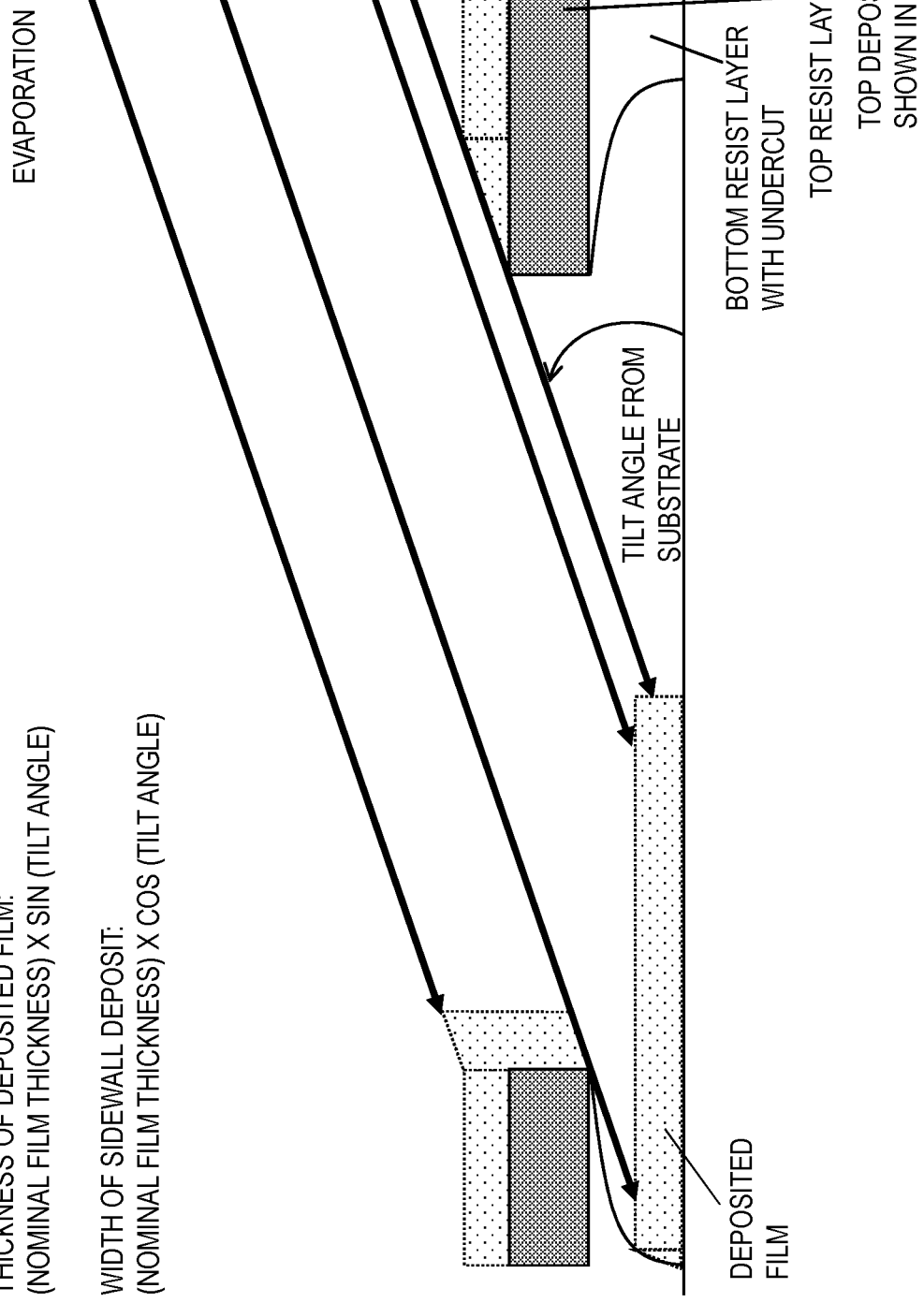

SHADOW MASK SIDEWALL TUNNEL JUNCTION FOR QUANTUM COMPUTING

DOMESTIC PRIORITY

This application is a divisional of U.S. patent application Ser. No. 16/413,850, filed May 16, 2019, which is a continuation of U.S. patent application Ser. No. 15/616,193, filed Jun. 7, 2017, which is now U.S. Pat. No. 10,367,134, the disclosures of which are incorporated by reference herein in their entirety.

BACKGROUND

The present invention generally relates to superconducting devices. More specifically, the present invention relates to shadow mask sidewall tunnel junctions for quantum computing applications.

Evaporation is a common method of thin-film deposition. The source material is evaporated in a vacuum. The vacuum allows vapor particles to travel directly to the target object (substrate) where they condense back to a solid state. Evaporation is used in microfabrication. During evaporation, a hot source material evaporates and then condenses on the substrate. Evaporation takes place in a vacuum, i.e., vapors other than the source material are almost entirely removed before the process begins. In a high vacuum (with a long mean free path), evaporated particles can travel directly to the deposition target without colliding with the background gas. At a typical pressure of 4-10 Pascals (Pa), a 0.4 nanometer particle has a mean free path of 60 meters. Evaporated atoms that collide with foreign particles can react with them. For example, if aluminum is deposited in the presence of oxygen, it will form aluminum oxide. Evaporated materials deposit non-uniformly if the substrate has a rough surface (as integrated circuits often do). Because the evaporated material attacks the substrate mostly from a single direction, protruding features block the evaporated material from some areas. This phenomenon is called "shadowing" or "step coverage."

A common technique for the fabrication of Josephson junctions involves double-angle shadow evaporation of aluminum through an offset mask, wherein the tunnel barrier is formed by the diffusive oxidation of the aluminum base layer. Shadow evaporation has been the most successful fabrication approach to date for making long-lived, high-coherence superconducting quantum bits (or qubits).

The Niemeyer-Dolan technique, also called the Dolan technique or the shadow evaporation technique, is a thin-film lithographic method to create nanometer-sized overlapping structures. This technique uses an evaporation mask that is suspended above the substrate. The evaporation mask can be formed from two layers of resist. Depending on the evaporation angle, the shadow image of the mask is projected onto different positions on the substrate. By carefully choosing the angle for each material to be deposited, adjacent openings in the mask can be projected on the same spot, creating an overlay of two thin films with a well-defined geometry New shadow mask evaporation techniques are needed to form tunnel junctions, such as Josephson junctions for superconducting quantum computing applications. In particular, new techniques are sought which can reduce variability of fabrication.

SUMMARY

Embodiments of the present invention are directed to a method of forming a sidewall tunnel junction. A non-limiting example of the method includes forming a first conducting layer using a first shadow mask evaporation, and forming a second conducting layer on a portion of the first conducting layer, where the second conducting layer is formed using a second shadow mask evaporation. The method includes forming an oxide layer on the first conducting layer and the second conducting layer and forming a third conducting layer on part of the oxide layer, such that the sidewall tunnel junction is positioned between the first conducting layer and the third conducting layer.

Embodiments of the invention are directed to a method of forming a sidewall tunnel junction. A non-limiting example of the method includes forming a non-metal layer having a height dimension greater than a width dimension, forming a first conducting layer on a portion of the non-metal layer, where the first conducting layer is formed using a first shadow mask evaporation, forming an oxide layer on the first conducting layer, and forming a second conducting layer on part of the oxide layer, such that the sidewall tunnel junction is positioned between the first conducting layer and the second conducting layer.

Embodiments of the present invention are directed to a method of forming a sidewall tunnel junction. A non-limiting example of the method includes forming a first conducting layer using a first shadow mask evaporation, where the first conducting layer has a width dimension greater than a height dimension, and forming a second conducting layer on top of a portion of the first conducting layer, where the second conducting layer is formed using a second shadow mask evaporation. The method includes forming an oxide layer on the first conducting layer and the second conducting layer, where a part of the first conducting layer is underneath the second conducting layer, and forming a third conducting layer on a region of the oxide layer, such that the sidewall tunnel junction is positioned between the second conducting layer and the third conducting layer. The sidewall tunnel junction is also positioned between the part of the first conducting layer and the third conducting layer.

Embodiments of the present invention are directed to method of forming a sidewall tunnel junction. A non-limiting example of the method includes forming a first conducting layer using a first shadow mask evaporation, where the first conducting layer has a height dimension greater than a width dimension, forming an oxide layer on the first conducting layer, and forming a second conducting layer on the oxide layer covering a top portion and a side portion of the first conducting layer, such that the sidewall tunnel junction is positioned between the second conducting layer and the top and side portions of the first conducting layer. The second conducting layer is formed using a second shadow mask evaporation.

Embodiments of the invention are directed to a tunnel junction device. A non-limiting example of the device includes a first conducting layer having a height dimension greater than a width dimension, an oxide layer formed on the first conducting layer, and a second conducting layer on the oxide layer covering a side portion of the first conducting layer, such that the oxide layer forms a sidewall tunnel junction between the second conducting layer and the side portion of the first conducting layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 28 depicts a flow chart of a method of forming a sidewall tunnel junction of an out-of-plane Josephson junction device according to embodiments of the present invention;

FIG. 29 depicts a flow chart of a method of forming a sidewall tunnel junction of an out-of-plane Josephson junction device according to embodiments of the present invention;

FIG. 31 is a cross-sectional view of FIG. 30 to illustrate concepts according to embodiments of the present invention; and FIG. 32 is a cross-sectional view of FIG. 30 to illustrate concepts according to embodiments of the present invention; and FIG. 33 is a cross-sectional view of FIG. 30 to illustrate concepts according to embodiments of the present invention.

Figure 1:
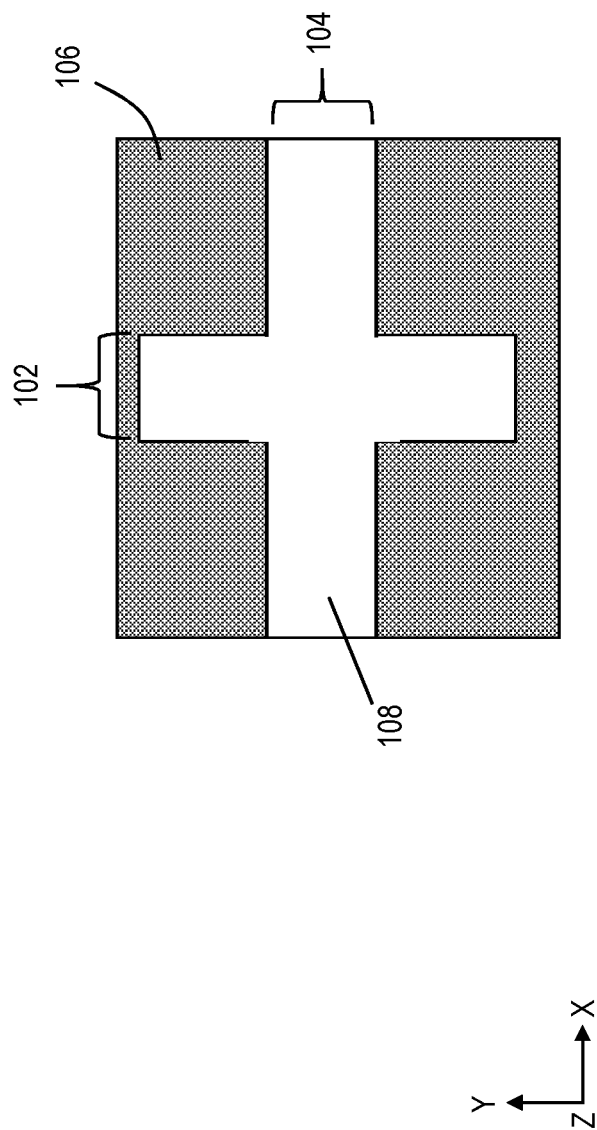
FIG. 1 depicts a top view of fabricating a Josephson tunnel junction device according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, technologically-relevant tunnel junctions for application in quantum computing are made with superconductors and have dimensions of about 100 nanometers on a side. The two main types of tunnel junctions utilized by researchers in the field of quantum computing are obtained by the Dolan Bridge or Manhattan techniques. Both produce in-plane tunnel junction geometries. An in-plane tunnel junction has its greatest area in-plane, and if the plane is defined by the surface of the substrate (e.g., which contains the orthogonal x and y axes), then the greatest area belonging to the tunnel junction is contained in the plane containing the x and y axes. The smallest area would be defined by a direction not contained in the surface of the substrate (e.g., the perpendicular z-axis, or a tilted/angled axis not parallel to the substrate) and another orthogonal direction contained in the plane (e.g., x-axis, y-axis or a linear combination of the two), as compared to the in-plane area (contained in the plane of the x and y axes). Two orthogonal directions are at right angles to each other. A tilted/angled direction is non-orthogonal with the plane of the substrate (but may be orthogonal with a direction contained in the plane). The plane containing the x and y axes may also designate a plane that is parallel (e.g., not intersecting) with the surface of the substrate. The plane containing the x and y axes can also designate a plane that is in close proximity to the surface of the substrate but not intersecting it. A tunnel junction made by the Dolan Bridge technique is referred to as a Dolan junction, while a tunnel junction made by the Manhattan technique is referred to as a Manhattan junction. A Manhattan junction can be fabricated utilizing a pattern known as a Manhattan crossing during lithography, named as such because it has intersecting streets and avenues at right angles.

Turning now to an overview of the aspects of the invention, one or more embodiments of the invention address the above-described shortcomings of the prior art by providing a Josephson tunnel junction with out-of-plane geometry. The out-of-plane geometry can include sidewall geometry or fin geometry. In the out-of-plane Josephson junction device, the Josephson junction area is perpendicular to or tilted/angled with respect to the plane of the substrate, and the Josephson junction area is dominated by the thickness of a layer such as the deposited film or a pre-existing fin. As used in embodiments of the present invention, shadow mask or angle evaporation are fabrication techniques that can be utilized in making high quality superconducting qubits. A Josephson junction is a type of tunnel junction, which consists of superconducting metal on either side of a weak link, such as an oxide layer (known as a tunnel barrier), a short section of non-superconducting metal, or a physical constriction in a superconductor. The superconducting metal (instead of regular metal) makes a Josephson junction a special type of tunnel junction. Finally, a superconducting qubit is a special case of a qubit and is made using one or more Josephson junctions. Therefore, the Josephson junction is the required component of a superconducting qubit. Other qubits exist but are not made of Josephson junctions.

More specifically, the above-described aspects of the invention address the shortcomings of the prior art by providing a structure that has an out-of-plane Josephson tunnel junction and is made by shadow mask evaporation. Critical current ($I_c$) of a Josephson junction is best predicted by the area of the tunnel junction (for a given oxidation condition). This out-of-plane Josephson junction (or area of the out-of-plane Josephson junction) is controlled by the lithographic dimension and film thickness. The uncertainty in the out-of-plane Josephson junction area is less dependent on the lithographic dimensions than in-plane techniques. Therefore, an immediate advantage of out-of-plane Josephson junctions is that the imprecision in the area of the junction is a combination of the imprecision of one lithographic dimension and the imprecision of the thickness of the layer which provides the out-of-plane junction. If the imprecision of the thickness is smaller than the imprecision of one lithographic dimension, this type of junction should result in lower overall imprecision than for those in-plane junctions that depend on the imprecision of two lithographic dimensions. One other beneficial aspect of embodiments of the present invention relies on the out-of-plane overlap contributing significantly to the area of the Josephson tunnel junction. Additionally, the Josephson junction device having this out-of-plane Josephson junction is reproducible for very small junctions.

Turning now to a more detailed description of aspects of the present invention, FIGS. 1-9 depict fabrication of a Josephson tunnel junction device 100 according to embodiments of the present invention. FIG. 1 depicts a top view of fabricating a Josephson tunnel junction device 100 according to embodiments of the present invention. A resist layer 106 is deposited on a substrate 108. The resist layer 106 can be a single or bilayer resist, can include one or more underlayers, such as an anti-reflective coating (ARC), a planarizing layer, or hardmask materials, or can be another stack including a resist, as understood by one skilled in the art. The resist layer 106 is patterned to have a Manhattan crossing of trenches 102 and 104 that expose the substrate 108. In the Manhattan technique, trench 102 is generally referred to as an avenue and trench 104 is generally referred to as a street. The substrate 108 can be a wafer on a wafer stage, and the wafer stage holds and moves the wafer substrate during the fabrication as understood by one skilled in the art.

Non-limiting examples of suitable materials for the substrate 108 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), ZnTe (zinc telluride)), sapphire, or quartz, or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

The pattern of trenches 102 and 104 in the resist layer 106 can be performed by lithographic patterning and followed by development of the resist layer 106. In one case, the patterning of the trenches 102 and 104 can be by photolithographic patterning that patterns the resist 106 on the substrate 108, and the development process can be, for example, TMAH developer. Additional developers are generally known in the art. The pattern of trenches 102 and 104 in the resist layer 106 can alternatively be performed by lithographic patterning and followed by an etching. In one case, the patterning of the trenches 102 and 104 can be by photolithographic patterning that patterns the resist 106 on the substrate 108, and the etching process can be, for example, a reactive ion etching process that removes exposed portions of the resist 106 in order to form desired patterns discussed herein.

Additionally, it should be noted that junctions in embodiments of the invention can be made with a single step of lithography. By not having multiple steps of lithography, embodiments of the present invention do not need to remove the resist or perform lift off in between evaporation steps, and then spin resist again and expose another lithographic pattern. Rather, embodiments of the present invention are specifically designed to be used with a single patterning step and multiple evaporations/oxidations done without breaking vacuum in the same evaporator.

A photoresist is a light-sensitive material. A positive resist is a type of photoresist in which the portion of the photoresist that is exposed to light becomes soluble to the photoresist developer. The unexposed portion of the photoresist remains insoluble to the photoresist developer. On the other hand, a negative photoresist is a type of photoresist in which the portion of the photoresist that is exposed to light becomes insoluble to the photoresist developer. The unexposed portion of the photoresist is dissolved by the photoresist developer.

Additionally, embodiments of the present invention can utilize electron-beam lithography (often abbreviated as e-beam lithography) which is the practice of scanning a focused beam of electrons to draw custom shapes (i.e., exposing) on a surface covered with an electron-sensitive film called an electron-beam (or e-beam) resist. The electron beam changes the solubility of the electron-beam resist, enabling selective removal of either the exposed or non-exposed regions of the resist by immersing it in a solvent (i.e., developing). The purpose, as with photolithography, is to create very small structures in the resist that can subsequently be transferred to the substrate material, often by etching or deposition. Non-limiting examples of suitable electron-beam resists include Poly(methyl methacrylate) (PMMA), which is a type of positive electron-beam resist, and Hydrogen silsesquioxane (HSQ), which is a type of negative electron-beam resist. Analogous to photoresist, a positive electron-beam resist is a type of resist in which the portion of the resist that is exposed to the electron beam (as opposed to light) becomes soluble to the electron-beam resist developer. The unexposed portion of the electron-beam resist remains insoluble to the electron-beam resist developer. On the other hand, a negative electron-beam resist is a type of resist in which the portion of the resist that is exposed to the electron beam (as opposed to light) becomes insoluble to the electron-beam resist developer. The unexposed portion of the electron-beam resist is dissolved by the electron-beam resist developer. Other methods for performing e-beam lithography, for example but not limited to using lift off resist (LOR) or electron-beam resist bilayers, are understood by one skilled in the art.

Figure 2:
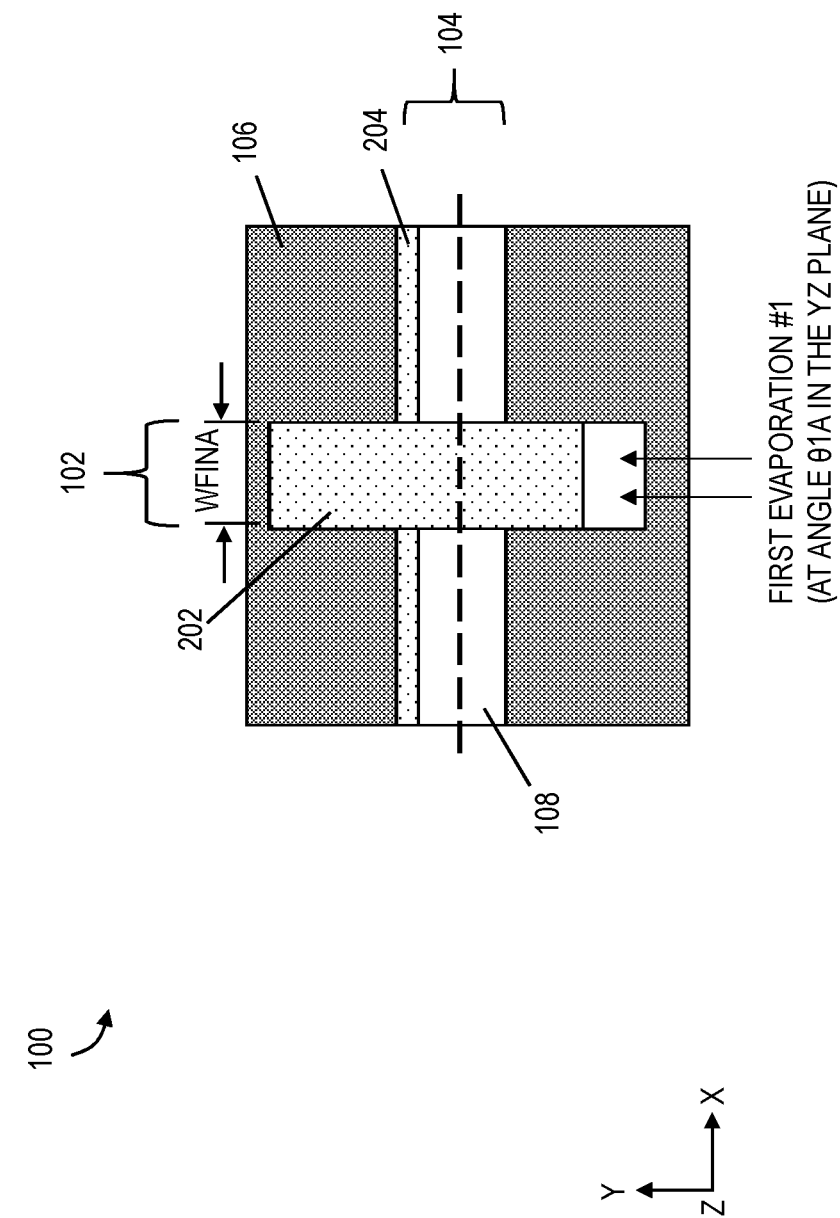
FIG. 2 depicts a top view of fabricating the Josephson tunnel junction device according to embodiments of the present invention.

FIG. 2 depicts a top view of fabricating the Josephson tunnel junction device 100 according to embodiments of the present invention. FIG. 2 illustrates the first shadow evaporation (evaporation #1) along the y-axis direction as shown. The first shadow evaporation is configured to form a tall but narrow superconducting film 202 with height H1A (shown in FIG. 3) and width WfinA. The superconducting film 202 is formed in the trench 102 and on a sidewall 204 of the resist 106 in the trench 104. The sidewall 204 of superconducting film 202 runs/extends along the x-axis direction as shown (e.g., has a greater length dimension in the x-axis than dimensions in the y-axis or z-axis) in trench 104 so as to be perpendicular to the superconducting film 202 (running in the y-axis), but these films are not physically connected to each other (for example, FIGS. 30-33 illustrate views where the sidewall deposit is collected at the resist and does not connect to the bottom film). Referring to FIG. 2, the thickness of the resist 106 (in the z-axis perpendicular to the page) is designed as tall enough given a tilt angle θ1A relative to the plane of the substrate 108, that superconducting film 202 is not connected to sidewall film 204.

For explanation purposes and not to obscure the figures, no deposit of material such as material from the first, second, third evaporations will be shown on top of the resist layer 106 or on top of sidewall layers 204, 404, 604, 1604, 1804, 1904, 2204, or 2404 (in Josephson junction devices 100, 1000, 1600, and 2200). Additionally, it should be understood that any material on top of the resist layer 106 will eventually be lifted off when the resist layer 106 is removed except where noted otherwise. Likewise, it should be understood that any material attached only to the sidewall of the resist layer 106, as opposed to being attached to the sidewall and one other surface (such as the substrate 108 or another evaporated film which is anchored on the surface), will eventually be lifted off when the resist layer 106 is removed except where noted otherwise.

It should be understood that lift off is a way to finish the device. Lift off can be done by using a solvent, such as Dow® Microposit™ Remover 1165 or acetone, to remove the resist layer at the end, along with any materials that are attached to the resist but nothing else. One skilled in the art understands how to perform lift off.

Figure 3:
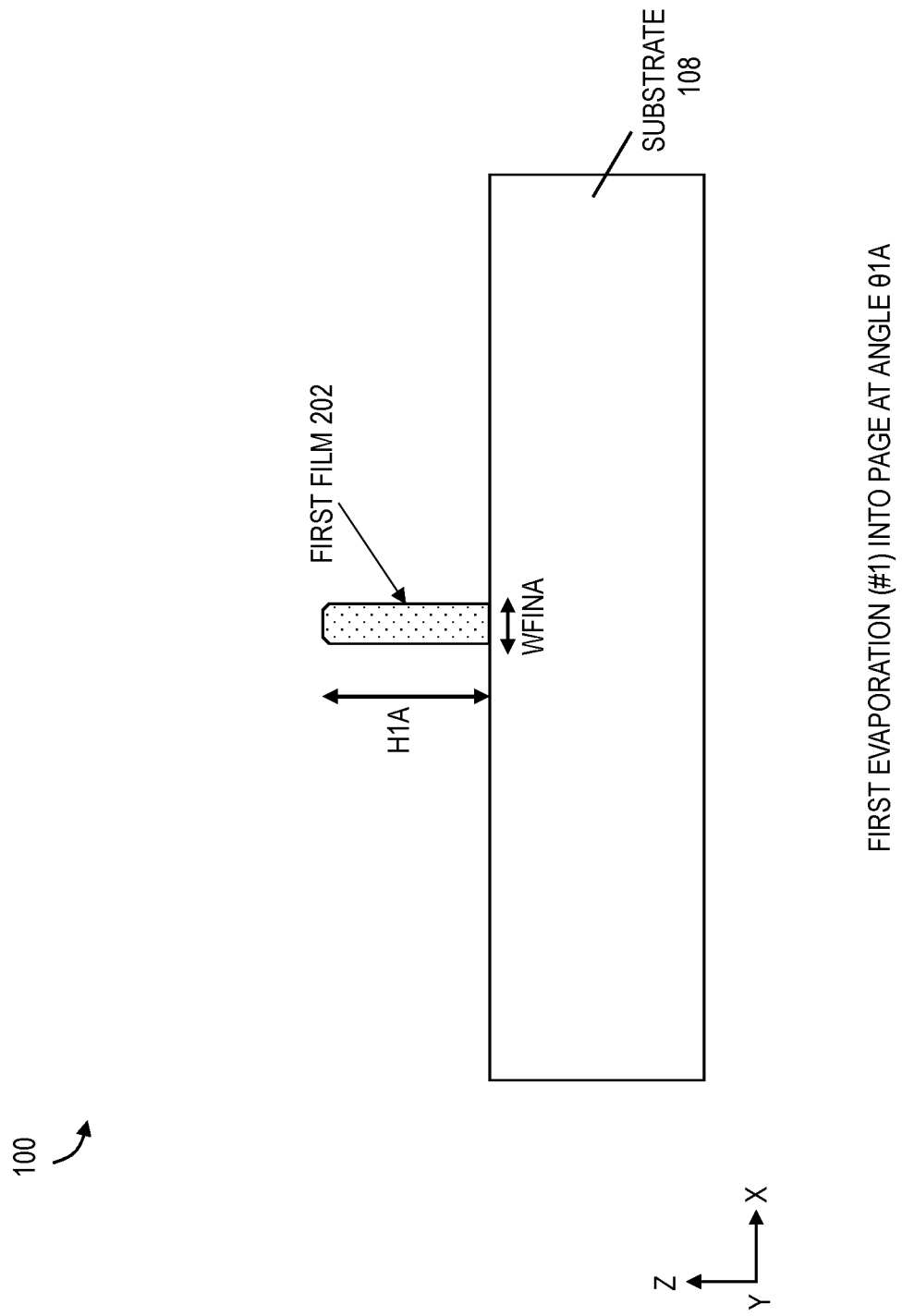
FIG. 3 depicts a cross-sectional view of FIG. 2 according to embodiments of the present invention.

FIG. 3 is a cross-sectional view of FIG. 2 according to embodiments of the present invention. The cross-section is taken along the dashed line in FIG. 2. The height H1A of the superconducting film 202 in the z-axis can range from about 30 nanometers (nm) to 300 nm. The width WfinA of the superconducting film 202 in the x-axis can range from about 20 nm to 200 nm. The first shadow evaporation (#1) is into the page in FIG. 3 thereby forming the superconducting film 202. The first shadow evaporation can be a performed at angle θ1A measured from substrate/wafer 108 (or wafer stage holding the substrate 108). For example, the source of the evaporation (evaporator) typically evaporates into the substrate at a 90° angle (at right angle with the substrate 108) relative to the plane of substrate 108. For generating a tilt, the evaporation is performed at a smaller angle to the plane of substrate 108 (or wafer stage holding the substrate 108). In some embodiments of the present invention, the evaporation tilt angle θ1A used to form the first superconducting film 202 during the first evaporation can range from about 30° to 80°.

Figure 4:
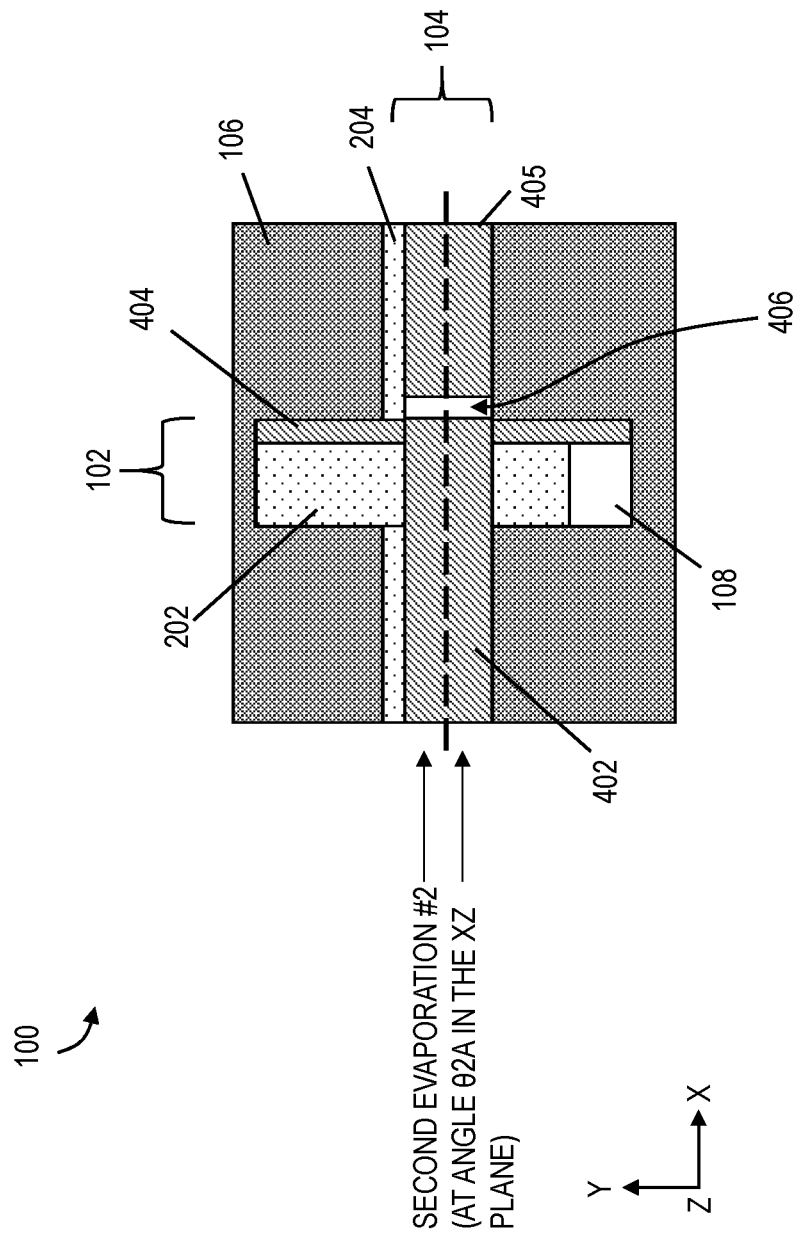
FIG. 4 depicts a top view of fabricating the Josephson tunnel junction device according to embodiments of the present invention.

FIG. 4 depicts a top view of fabricating the Josephson tunnel junction device 100 according to embodiments of the present invention. FIG. 4 illustrates rotating the wafer stage 90° (about its center) to perform the second shadow evaporation (e.g., evaporation #2). One skilled in the art should understand that the center is defined by a point in the middle of a plane, and usually, these wafer stages will be round or at least flat. Embodiments of the invention are referring to this flat stage about the center of the circle (or a point on the plane).

Figure 5:
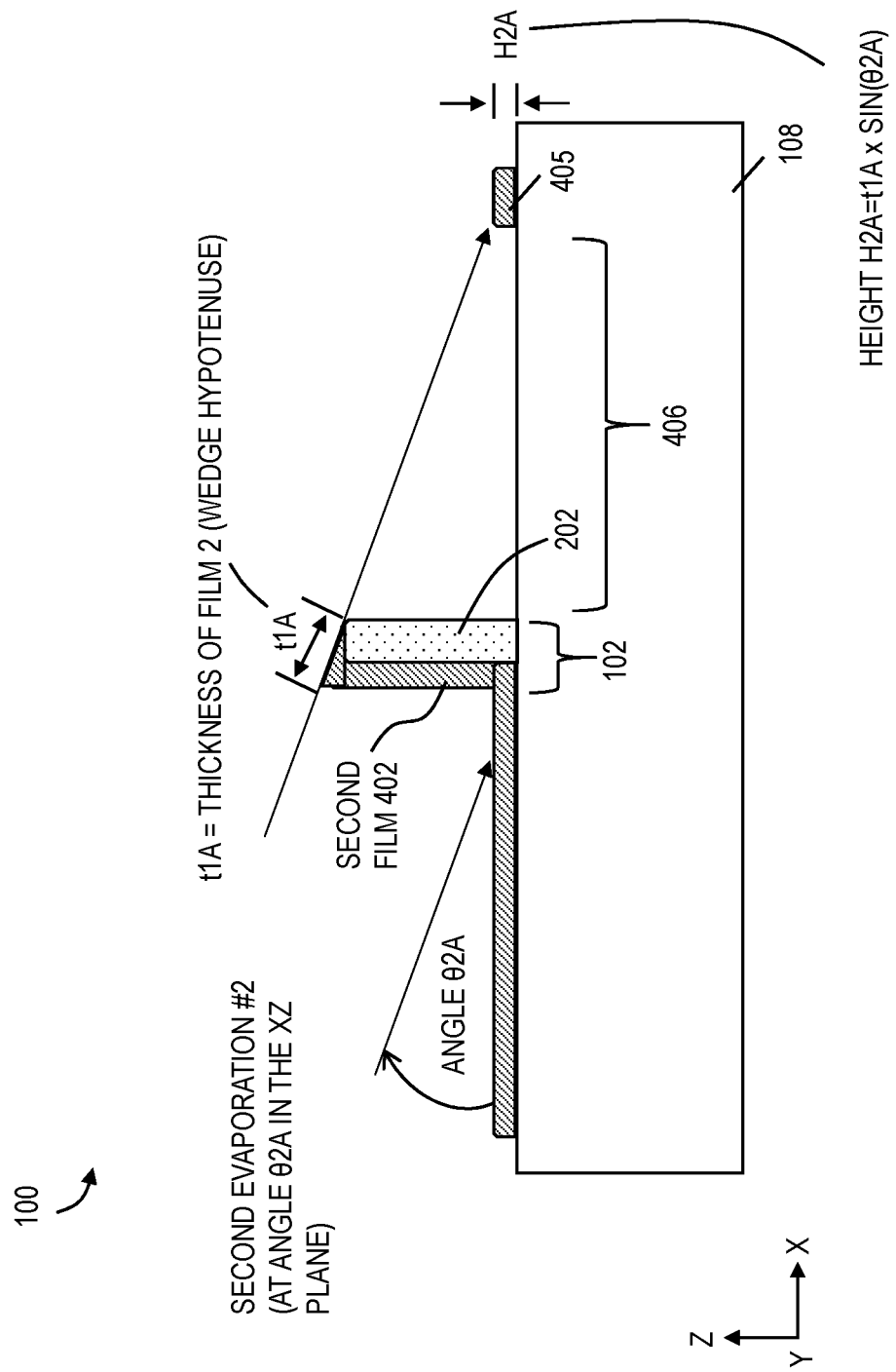
FIG. 5 depicts a cross-sectional view of FIG. 4 according to embodiments of the present invention.

The second shadow evaporation (evaporation #2) is from the left and is configured to form a thin superconducting film 402 with thickness t1A (shown in FIG. 5). The superconducting film 402 is formed in the trench 104 and on a sidewall 404 of the resist 106 in the trench 102. The sidewall 404 formed of superconducting film 402 runs/extends along the y-axis direction as shown (e.g., has a greater length dimension in the y-axis than dimensions in the x-axis or z-axis) in trench 104 to be perpendicular to the superconducting film 402 (running in the x-axis), but these films are not physically connected to each other (for example, FIGS. 30-33 illustrate views where the sidewall deposit is collected at the resist and does not connect to the bottom film). The second shadow evaporation creates a gap 406 on the back side of the first superconducting film 202 because the gap 406 is in the (evaporation) shadow of the first superconducting film 202 relative to the second evaporation angle θ2A relative to the plane of the substrate 108. To the right of gap 406, the shadowing of the second evaporation creates a patch 405 of superconducting film 202.

FIG. 5 depicts a cross-sectional view of FIG. 4 according to embodiments of the present invention. The cross-section is taken along the dashed line in FIG. 4. The second shadow evaporation (#2) is configured with low tilt angle θ2A from the substrate 108. In some embodiments of the present invention, the second evaporation angle θ2A used to form the second superconducting film 402 during the second evaporation can range from about 20° to 80°.

The thickness t1A is greater than or at least approximately equal to width WfinA of the second superconducting film 402, in order to result in a continuous second film 402 interrupted only by gap 406. The thickness t1A is the length of the wedge hypotenuse of the second superconducting film 402 that extends over the first superconducting film 202 and is equal to the nominal thickness of material deposited as typically monitored in the evaporation tool. As noted above, sidewall 404 does not participate in the device, as it is removed later by lift off. The sidewall 404 is only attached to the resist 106, and the sidewall 404 receives additional deposition and oxidation but does not participate in the device. The thickness t1A can range from about 20 nm to 100 nm. The height H2A of the second superconducting film 402 (and patch 405) in the z-axis is related to the thickness t1A by the geometric expression H2A=t1A×sin(θ2A), where angle θ2A is the tilt of the second shadow evaporation from the substrate 108, and H2A can range from about 10 nm to 100 nm. The width WfinA of the superconducting film 202 in the x-axis can range from about 20 nm to 200 nm.

Figure 6:
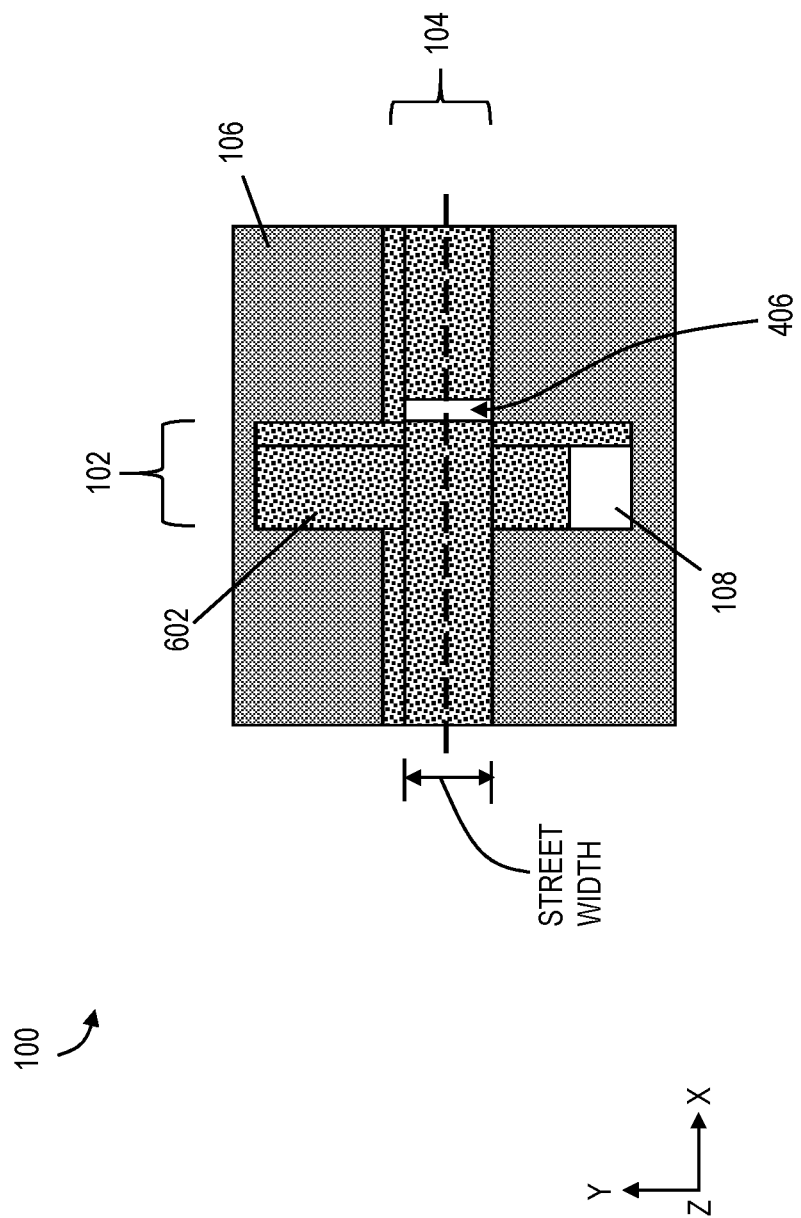
FIG. 6 depicts a top view of fabricating the Josephson tunnel junction device according to embodiments of the present invention.
Figure 7:
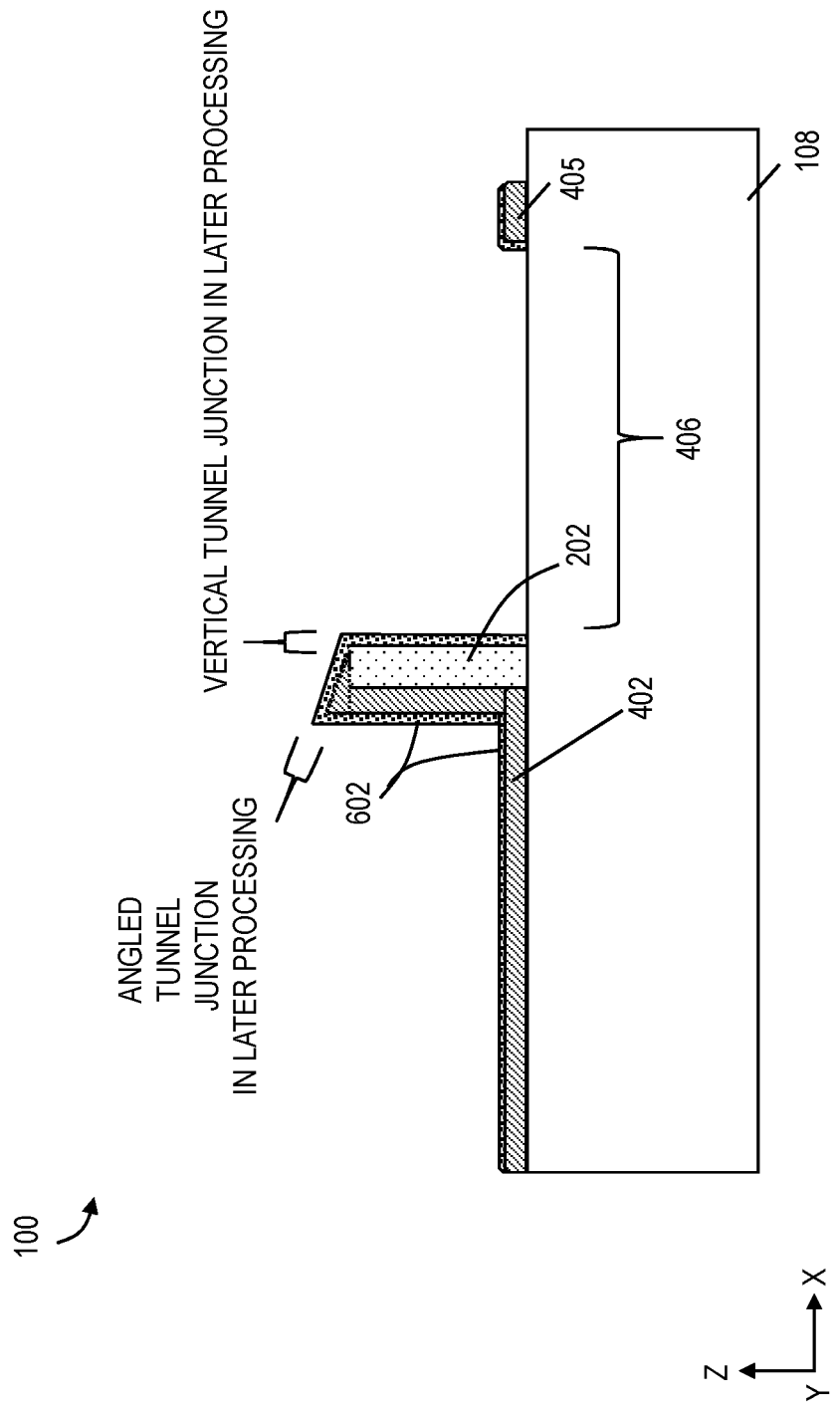
FIG. 7 depicts a cross-sectional view of FIG. 6 according to embodiments of the present invention.

FIG. 6 depicts a top view of fabricating the Josephson tunnel junction device 100 according to embodiments of the present invention. FIG. 6 shows that an oxidation layer 602 is grown on top of first superconducting film 202 and second superconducting film 402. For example, the superconducting metal of the first and second films 202 and 402 can be oxidized to form the oxidation layer 602. The oxide is typically grown by oxidizing the existing superconductor metal, such as Al, without breaking vacuum. This is done by introducing oxygen gas into the evaporation chamber or an attached oxidation chamber that the sample can be transferred to and from without vacuum break at this step. Alternatively, an oxide may be deposited instead of grown. FIG. 7 depicts a cross-sectional view of FIG. 6 according to embodiments of the present invention. FIG. 7 illustrates that the first superconducting film 202 and second superconducting film 402 have the oxidation layer 602 on top. Sidewall films 204 and 404 are also oxidized but they do not participate in the geometry of the final device because they are only attached to the resist layer 106 and will be removed by a lift off step at a later stage in the fabrication.

Figure 8:
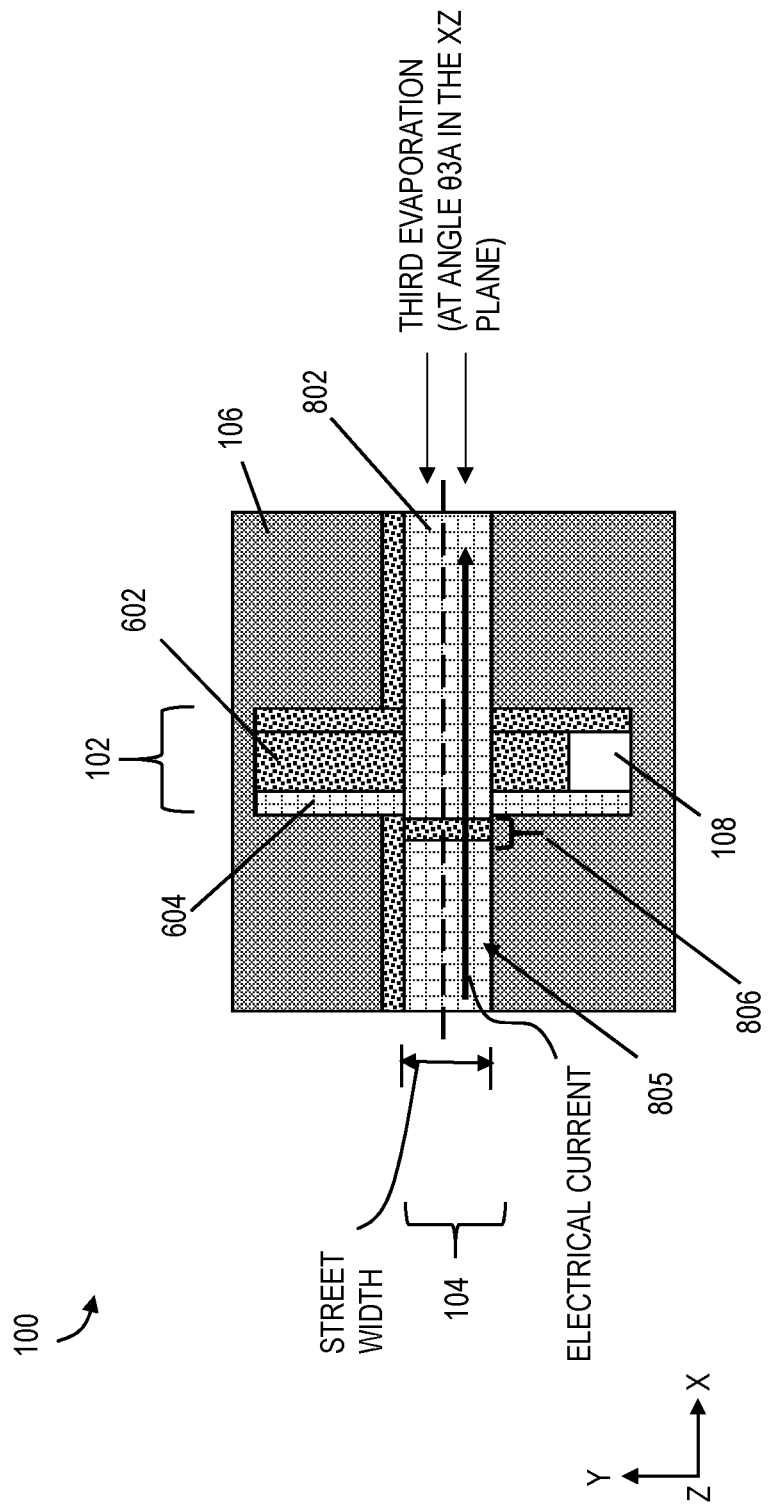
FIG. 8 depicts a top view of fabricating the Josephson tunnel junction device according to embodiments of the present invention.

FIG. 8 depicts a top view of fabricating the Josephson tunnel junction device 100 according to embodiments of the present invention. After oxidation, the wafer stage (holding the substrate 108) is rotated 180° (about its center). Then, the third shadow evaporation (evaporation #3) is performed with the tilt angle θ3A relative to the plane of the substrate 108 (which can be the same as evaporation #2) from the right to form a third superconducting film 802. The third shadow evaporation creates a gap 806 on the back side of the first superconducting film 202 because the gap 806 is in the (evaporation) shadow of the first superconducting film 202, the second superconducting film 402, and the oxidation layer 602 relative to the third evaporation angle θ3A. The third shadow evaporation creates a patch 805 of third superconducting film 802 on the opposite side of the gap 806. A sidewall film 604 is also formed on the resist layer 106 which is removed by a lift off step at a later stage in the fabrication.

Figure 9:
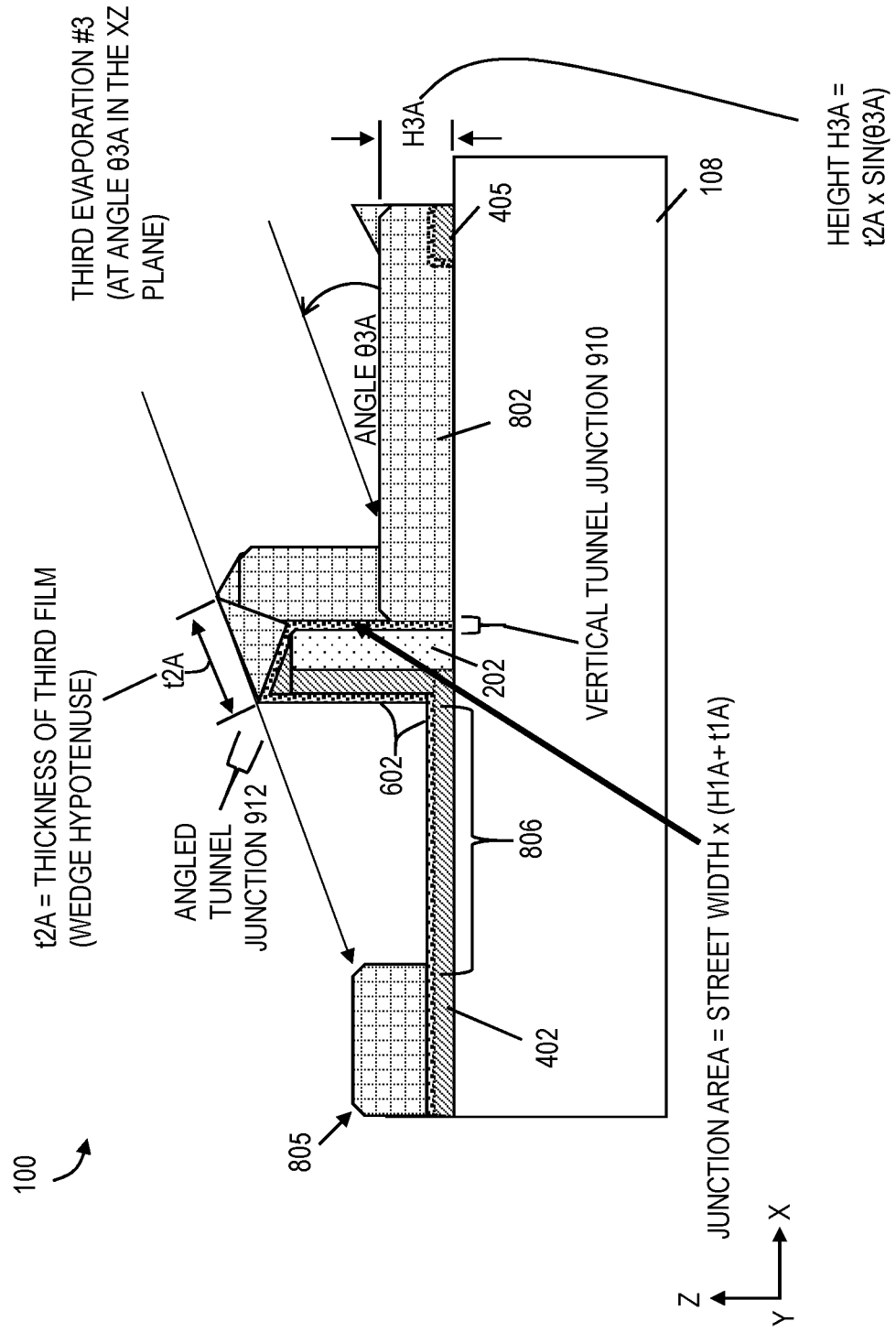
FIG. 9 depicts a cross-sectional view of FIG. 8 according to embodiments of the present invention.

FIG. 9 depicts a cross-sectional view of FIG. 8 according to embodiments of the present invention. The third tilt angle θ3A equals (or is about the same as) the second tile angle θ2A. The thickness of the third superconducting film 802 is thickness t2A. The thickness t2A is the length of the wedge hypotenuse of a portion of third superconducting film 802 above the first and second films 202 and 402 and above the oxidation layer 602. The third shadow evaporation is performed such that the thickness t2A>t1A. The thickness t2A can range from about 50 nm to 200 nm. The height H3A of the third superconducting film 802 satisfies the relation H3A=t2A×sin(θ3A), where θ3A is the tilt of third shadow evaporation (i.e., angle of the source evaporation) from the substrate 108. The Josephson tunnel junction device 100 has been formed in FIGS. 8 and 9. The tunnel junction has an electrode made by the combination of superconducting films 402 and 202, superconducting film 802, and the portion of oxide layer 602 sandwiched between the two electrodes. The Josephson tunnel junction device 100 has an out-of-plane tunnel junction. The out-of-plane tunnel junction includes a vertical tunnel junction 910 and an angled tunnel junction 912, as it relates to the flow of electrical current depicted by the electrical current flow arrow in FIG. 8. The vertical tunnel junction 910 is a portion of the oxide layer 602 that has a greater dimension in the z-axis (vertical direction) than in the x-axis (width direction). The angled tunnel junction 912 has a length greater than its thickness. A Josephson tunnel junction is formed by two superconducting films (i.e., superconducting electrodes) sandwiching the oxide layer 602. Also, other Josephson junctions at the far left and far right are formed, but these other Josephson junctions do not contribute to and/or affect the electrical current flow (i.e., critical current that flows at superconducting temperatures).

Particularly, junction area=street width×(H1A+t1A). The street width is the width of the trench 104 (i.e., street) along the y-axis minus the width along the y-axis of the sidewall deposit 204 (aside some edge imprecision). The street width can range from about 50 nm to 350 nm.

In some embodiments, the thickness t1A (of second superconducting film 402) or t2A (of third superconducting film 802) is the wedge hypotenuse (or length) because wedge hypotenuse (or length) coincides with the thickness given by the film thickness monitor that is used in the evaporator. The source evaporator is the device that contains the material (i.e., first, second, and third superconducting films) to be deposited by evaporation as understood by one skilled in the art.

As noted above, the Josephson junction area (of the vertical tunnel junction 910) is mainly defined by the oxide layer 602 in between the (right) side of the first superconducting film 202 and the (left) side of the third superconducting film 802. However, a smaller part of the Josephson junction area (i.e., the angled tunnel junction 912) can be defined by the oxide layer 602 in between the wedge hypotenuse (with length t1A) of second superconducting film 402 (above the first superconducting film 202) and the portion of the third superconducting film 802 immediately above the wedge hypotenuse (with length t1A) of second superconducting film 402. An arrow illustrating the electrical current flow is shown in FIG. 8 but not in FIG. 9. In FIG.

9 for the vertical tunnel junction 910, as an illustration from left to right, the electrical current flows into the left of the second superconducting film 402, through the first superconducting film 202, through the vertical tunnel junction (oxide layer 602), and into the third superconducting film 802. For the angled tunnel junction 912, a small portion of the electrical current can flow up the first superconducting film 202 and/or up the second superconducting film 402, through the angled oxide layer 602, and into the third superconducting film 802.

The first, second, and third superconducting films 202, 402, and 802 can each be the same superconducting material. In some embodiments of the present invention, one or more of the first, second, and third superconducting films 202, 402, and 802 can be different from one another.

There are various options in the fabrication of the Josephson tunnel junction device 100. The first, second, and third shadow evaporations can each use the same tilt angle, such that the tilt angle θ1A=tilt angle θ2A=tilt angle θ3A. As another option, the tilt angle θ3A for the third shadow evaporation is larger than the tilt angle θ2A for the second evaporation. Additionally, in order to overcome patch 405 on the right, height H3A=t2A×sin(θ3A) of third superconducting film 802 is greater or equal to height H2A=t1A×sin(θ2A) of second superconducting film 402 and patch 405. Otherwise, patch 405 could create a shadow in third superconducting film 802 and a gap separating third superconducting film 802 to the left of the patch 405 to third superconducting film 802 deposited on the back (i.e., on top) of patch 405. To ensure that no new gap is created by the shadow of patch 405, the height H3A can be at least twice (at least two times) the height H2A.

In the figures, it is noted that the wafer stage holding the substrate 108 can be rotated about its center. However, the figures maintain the x-axis as being horizontal for ease of understanding.

Figure 10:
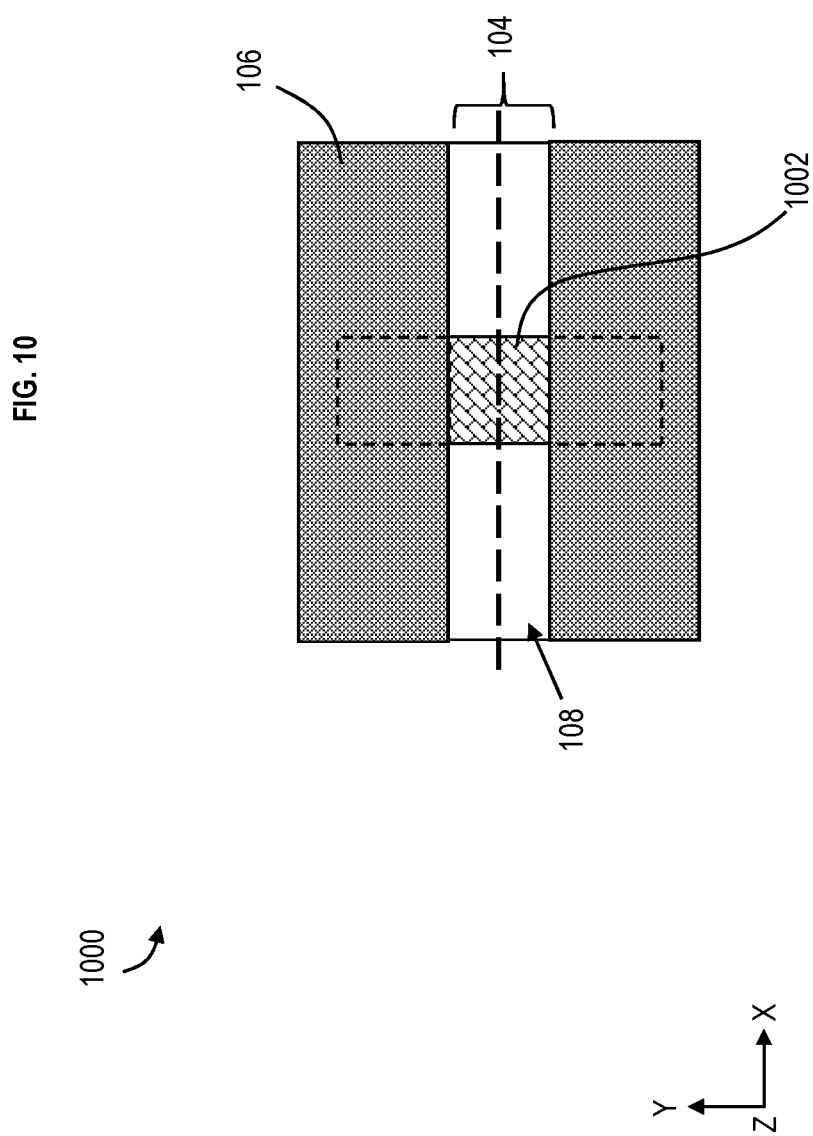
FIG. 10 depicts a top view of fabricating another Josephson tunnel junction device according to embodiments of the present invention.
Figure 11:
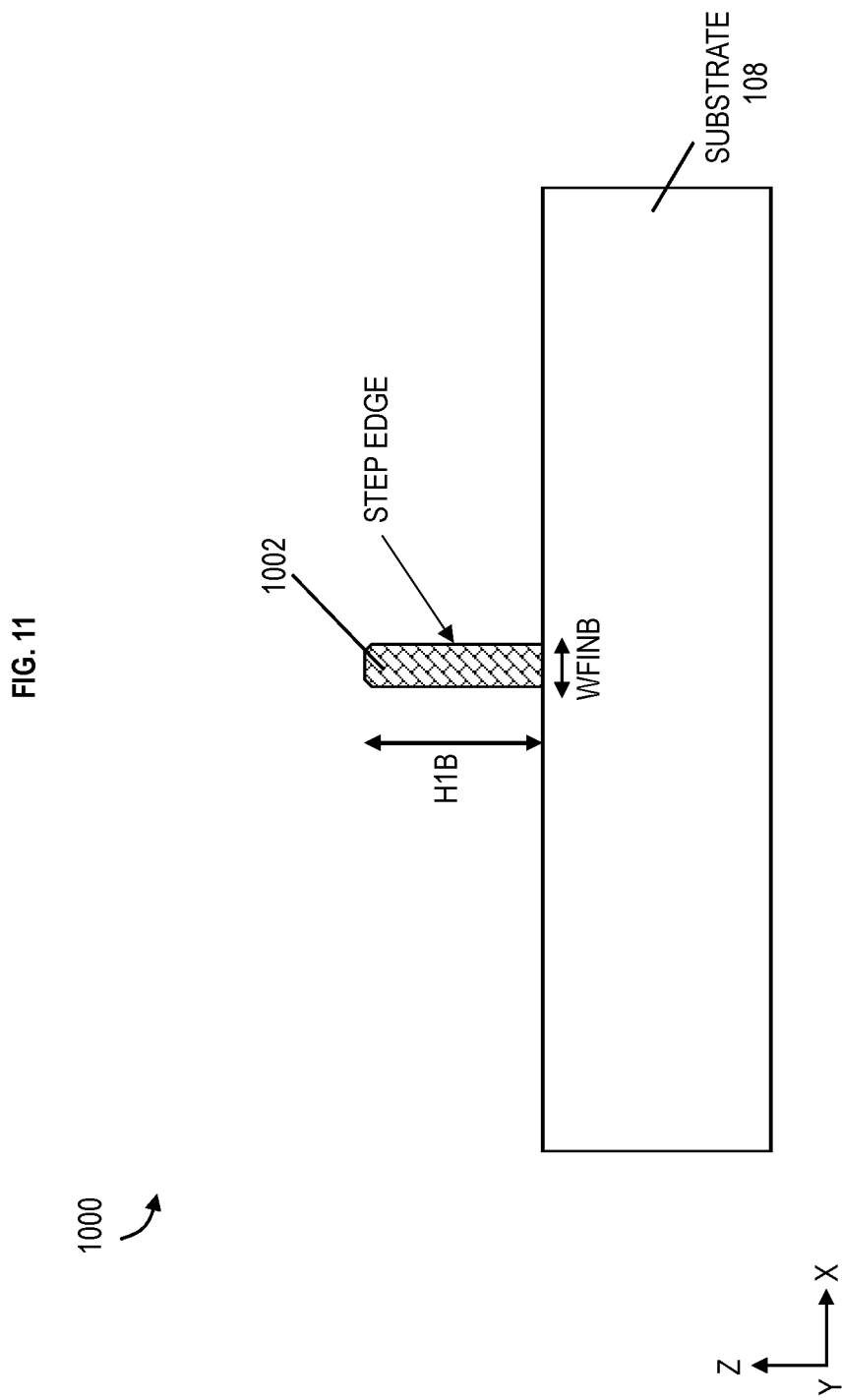
FIG. 11 depicts a cross-sectional view of FIG. 10 according to embodiments of the present invention.

FIGS. 10-15 depict fabrication of a Josephson tunnel junction device 1000 according to embodiments of the present invention, as discussed further below. FIG. 10 depicts a top view of fabricating a Josephson tunnel junction 100 according to embodiments of the present invention. FIG. 11 depicts a cross-section view of FIG. 10 according to embodiments of the present invention, taken along the dashed line in FIG. 10.

A step edge 1002 is formed on the substrate 108. The step edge 1002 is tall with height H1B but narrow with width WfinB. The step edge 1002 can be formed using lithography and etching. In some embodiments of the present invention, the step edge 1002 can be etched in the substrate 108. In some embodiments of the present invention, the step edge 1002 can be a layer that is deposited on the substrate 108 and then etched into the desired shape. The step edge 1002 is made of a material that is not superconducting (and not a regular metal). In some embodiments of the present invention, the material of the step edge 1002 can include silicon. In some embodiments of the present invention, the step edge 1002 can be an insulating material. The height H1B of the step edge 1002 in the z-axis can range from about 30 nm to 300 nm. The width WfinB of the step edge 1002 in the x-axis can range from about 20 nm to 200 nm.

A resist layer 106 is formed on top of the step edge 1002 and the substrate 108. The resist layer 106 can be patterned/formed to have the trench 104 (i.e., street). However, no trench 102 is needed in this example (i.e., avenue). The trench 104 is to be used for shadow evaporation.

Figure 12:
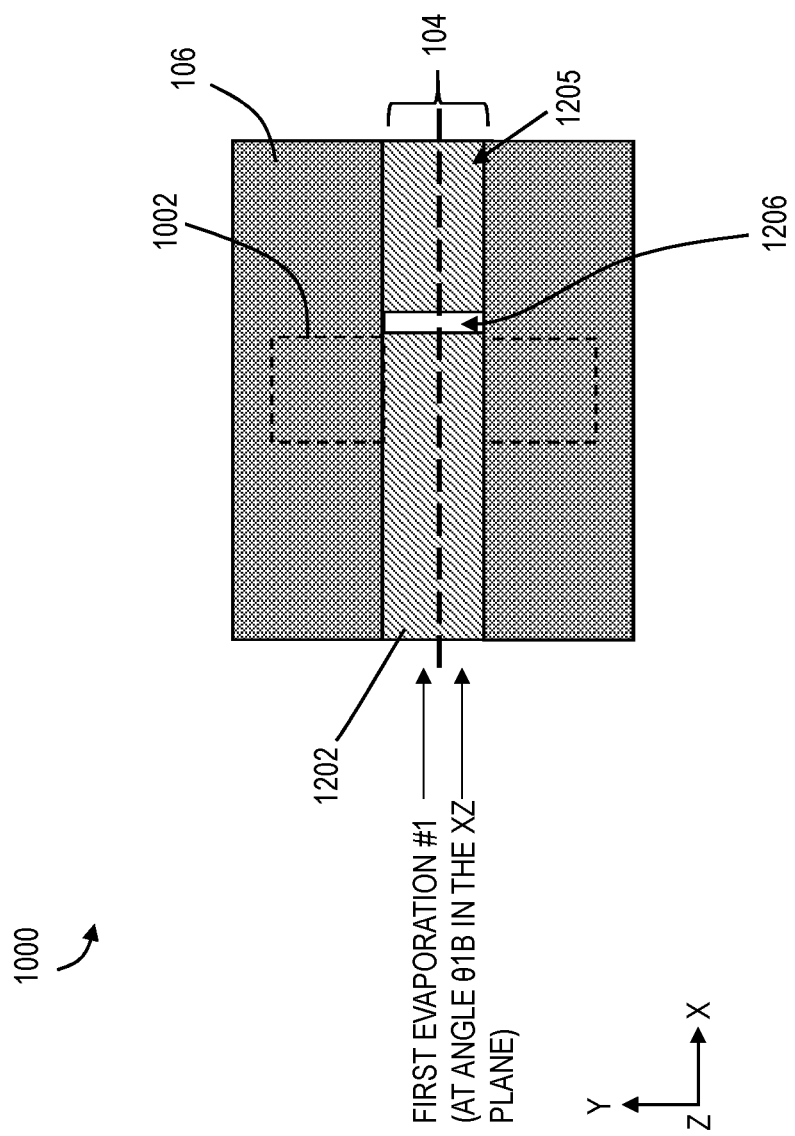
FIG. 12 depicts a top view of fabricating the Josephson tunnel junction device according to embodiments of the present invention.
Figure 13:
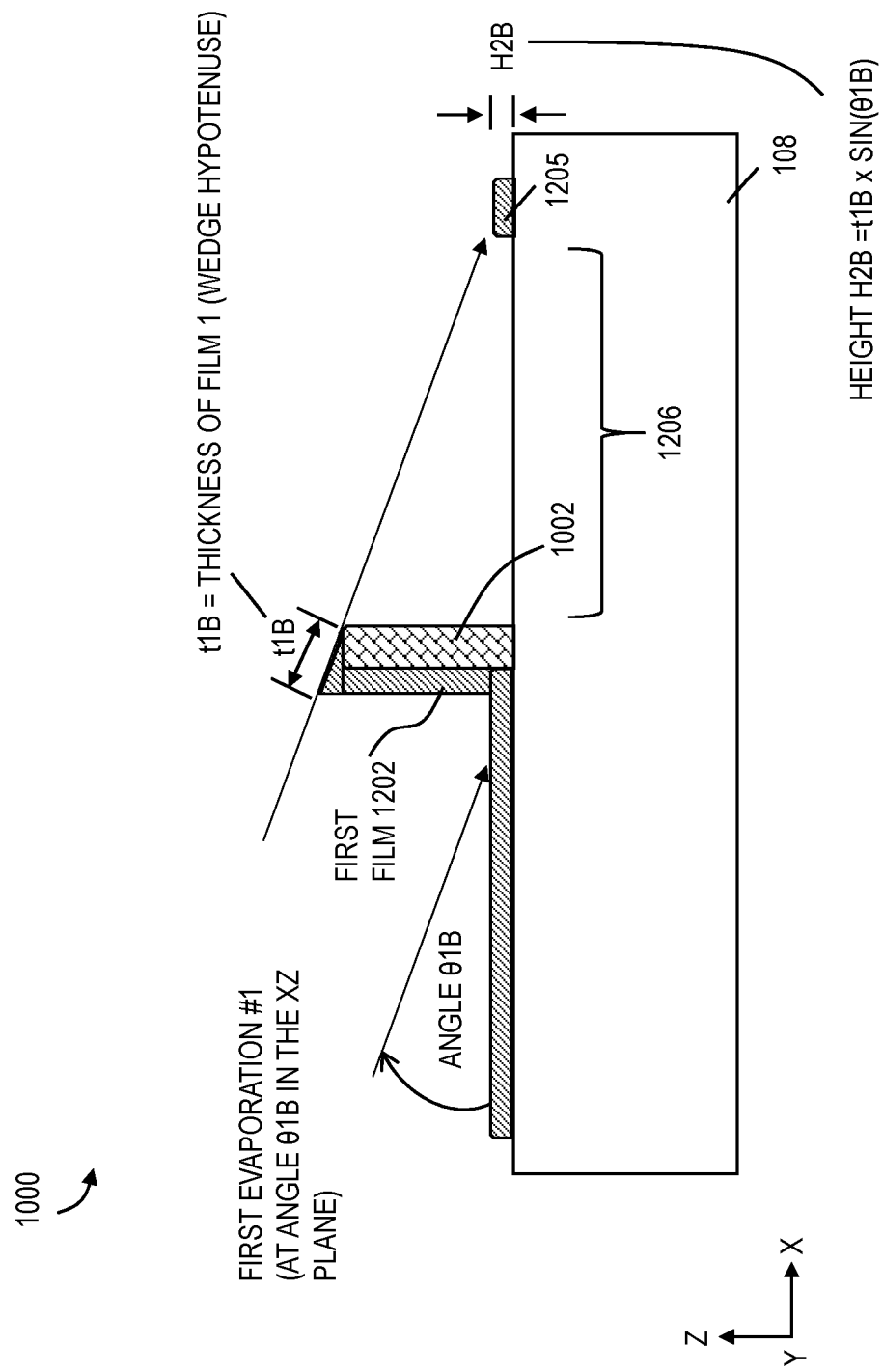
FIG. 13 depicts a cross-sectional view of FIG. 12 according to embodiments of the present invention.

FIG. 12 depicts a top view of fabricating the Josephson tunnel junction 1000 according to embodiments of the present invention. FIG. 13 depicts a cross-section view of FIG. 12 according to embodiments of the present invention, taken along the dashed line in FIG. 12.

The wafer stage (holding the substrate 108) is rotated 90° about its center. The first shadow evaporation is performed to deposit the first superconducting film 1202 in the trench 104. The first shadow evaporation is from the left with a tilt angle θ1B relative to the substrate 108 to form a thin first superconducting film 1202 with thickness t1B. The thickness of the first superconducting film 1202 is the length of the wedge hypotenuse of a portion of first superconducting film 1202 extending above the step edge 1002.

The thickness t1B can range from about 20 nm to 100 nm. The thickness t1B is greater than or at least approximately equal to WfinB. The height H2B=t1B×sin(θ1B) denotes the height of the first superconducting film 1202. The height H1B of the step edge 1002 causes a gap 1206 in the first superconducting film 1202 during the first shadow evaporation at tilt angle θ1B and a patch 1205 (of the first superconducting film 1202) on the right. The tilt angle θ1B can range from about 20° to 80°.

Figure 14:
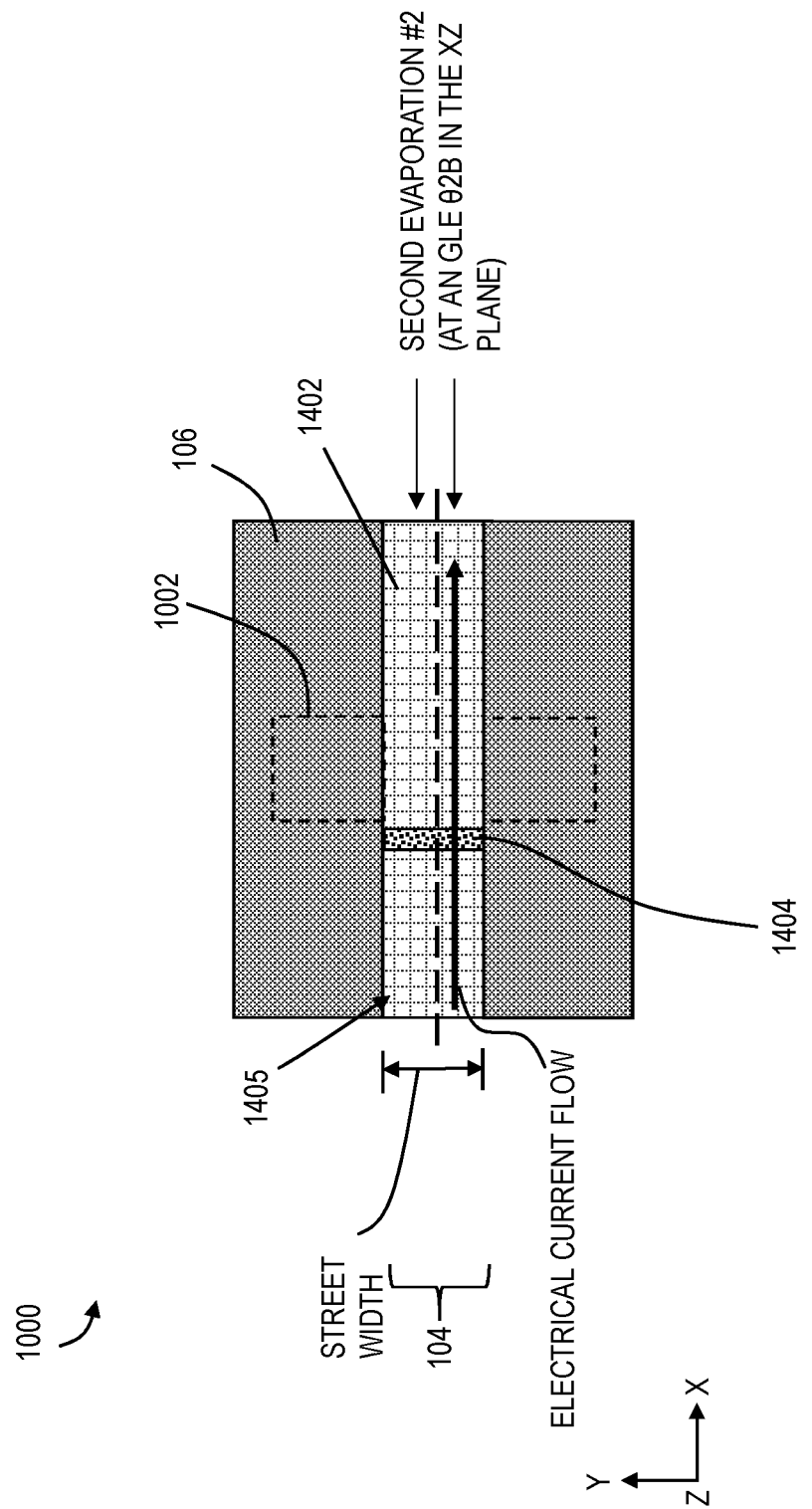
FIG. 14 depicts a top view of fabricating the Josephson tunnel junction device according to embodiments of the present invention.
Figure 15:
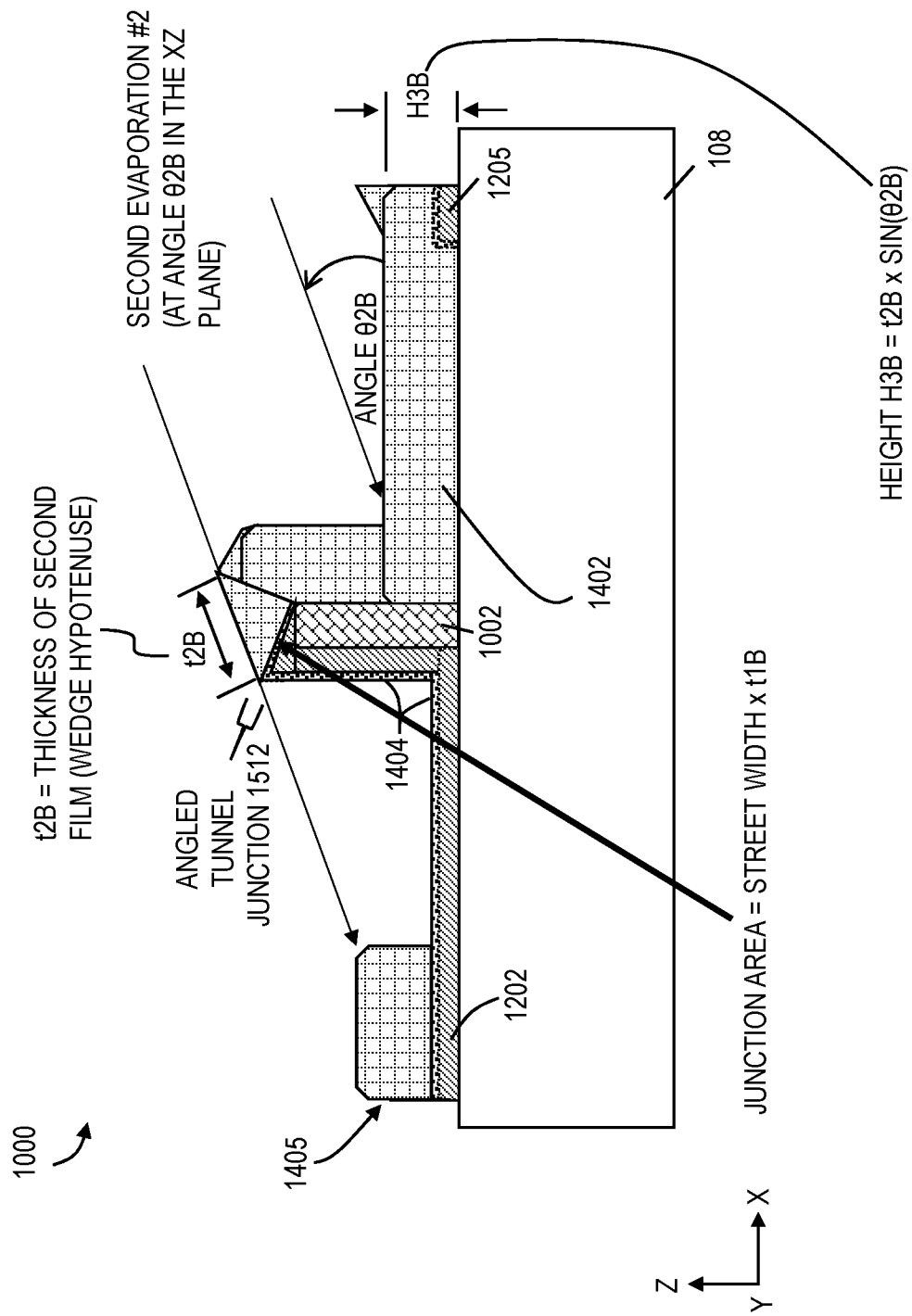
FIG. 15 depicts a cross-sectional view of FIG. 14 according to embodiments of the present invention.

FIG. 14 depicts a top view of fabricating the Josephson tunnel junction 1000 according to embodiments of the present invention. FIG. 15 depicts a cross-section view of FIG. 14 according to embodiments of the present invention, taken along the dashed line in FIG. 14. An oxide layer 1404 is formed on top of the first superconducting film 1202 just as discussed in FIGS. 1-9. The oxide layer 1404 can be the same oxide material as the oxide layer 602 in some embodiments of the present invention. In other embodiments of the present invention, the oxide layer 1404 can be a different oxide material than the oxide layer 602.

After oxidation (or before), the wafer stage is rotated 180° about its center. Then, the second shadow evaporation (#2) is performed with tilt angle θ2B to deposit a second superconducting film 1402 in the trench 104. The second shadow evaporation can be performed with (about) the same tilt (angle θ2B=angle θ1B) to deposit a thicker layer of the second superconducting film 1402 than the first superconducting film 1202. The second shadow evaporation results in a patch 1405 of the second superconducting film 1402. The tilt angle θ2B can range from about 20° to 80°. The thickness t2B of the second superconducting film is the wedge hypotenuse (length). The Josephson junction device 1000 has the condition in which the thickness t2B>t1B. The thickness t2B can range from about 50 nm to 200 nm. The height H3B=t2B×sin(θ2B) denotes the height of the second superconducting film 1402. Alternatively to rotating the stage by 180° and tilting the stage by an angle θ2B, one can also not rotate the stage and use a tilt angle of 180°−θ2B and achieve the same evaporation (#2) result.

The Josephson tunnel junction device 1000 has an out-of-plane tunnel junction. The out-of-plane tunnel junction includes an angled tunnel junction 1512, as it relates to the flow of electrical current depicted by the electrical current flow arrow in FIG. 14. The angled tunnel junction 1512 has a length greater than its thickness, and the angled tunnel junction 1512 is angled downward from left to right in the x-axis in FIG. 15. As utilized for electrical current flow, the Josephson tunnel junction of the oxide layer 1404 is formed between the triangular portion of the first superconducting film 1202 (denoted by length t1B) and the triangular second superconducting film 1402 (denoted by length t2B). Part of the angled tunnel junction 1512 is above the step edge 1002 and the other part extends above a vertical portion of the first superconducting film 1202.

Particularly, the junction area (street width)×(t1B). The street width is the width of the trench 104 (i.e., street) along the y-axis. The first superconducting film 1202 is in the trench 104, thereby approximately matching the street width (aside from imprecision in the deposition and lithography, such as evaporation into an undercut in the resist layer 106). In other words, there is no sidewall narrowing of the first superconducting film 1202 resulting from fabrication of the Josephson tunnel junction device 1000 in FIGS. 10-15, corresponding to the sidewall deposits 204, 404 and 604. The benefit of not having sidewall narrowing is greater uniformity of the street width across an extended sample, since the shadow from the sidewall deposit can possibly introduce additional imprecision to the street width, and it depends on the thickness of deposited material from the first evaporation as related to first film 202 in FIGS. 2-3. The street width can range from about 50 nm to 350 nm.

An arrow illustrating the electrical current flow is shown in FIG. 14 but not in FIG. 15. As an illustration from left to right, the electrical current flows into the left of the first superconducting film 1202, through the first superconducting film 1202, through the angled tunnel junction 1512 (oxide layer 1404), into the second superconducting film 1402 (triangular portion with length t2B), down through the second superconducting film 1402, and out the right side of the second superconducting film 1402.

The first and second superconducting films 1202 and 1402 can each be the same superconducting material. In some embodiments of the present invention, the first and second superconducting films 1202 and 1402 can be different superconducting materials.

There are various options in the fabrication of the Josephson tunnel junction device 1000. In some embodiments of the present invention, the second shadow evaporation (angle θ2B) can use a larger tilt angle than the first shadow evaporation (angle θ1B). In order to overcome patch 1205 on the right, height $H3B=t2B\times\sin(\theta2B)$ of second superconducting film 1402 is greater or equal to height $H2B=t1B\times\sin(\theta1B)$ of first superconducting film 1202 and patch 1205. Otherwise, patch 1205 could create a shadow in second superconducting film 1402 and a new gap separating second superconducting film 1402 to the left of the patch 1205 to second superconducting film 1402 deposited on the back (i.e., on top) of patch 1205. To ensure that no new gap is created by the shadow of patch 1205, the height H3B can be at least twice (at least two times) the height H2B. Additionally, the step edge 1002 can be made of resist, and the step edge 1002 can be removed (or dissolved, or chemically etched away), thereby leaving an open space under the angled tunnel junction 1512 (i.e., without lifting off the material above the step edge 1002).

Figure 16:
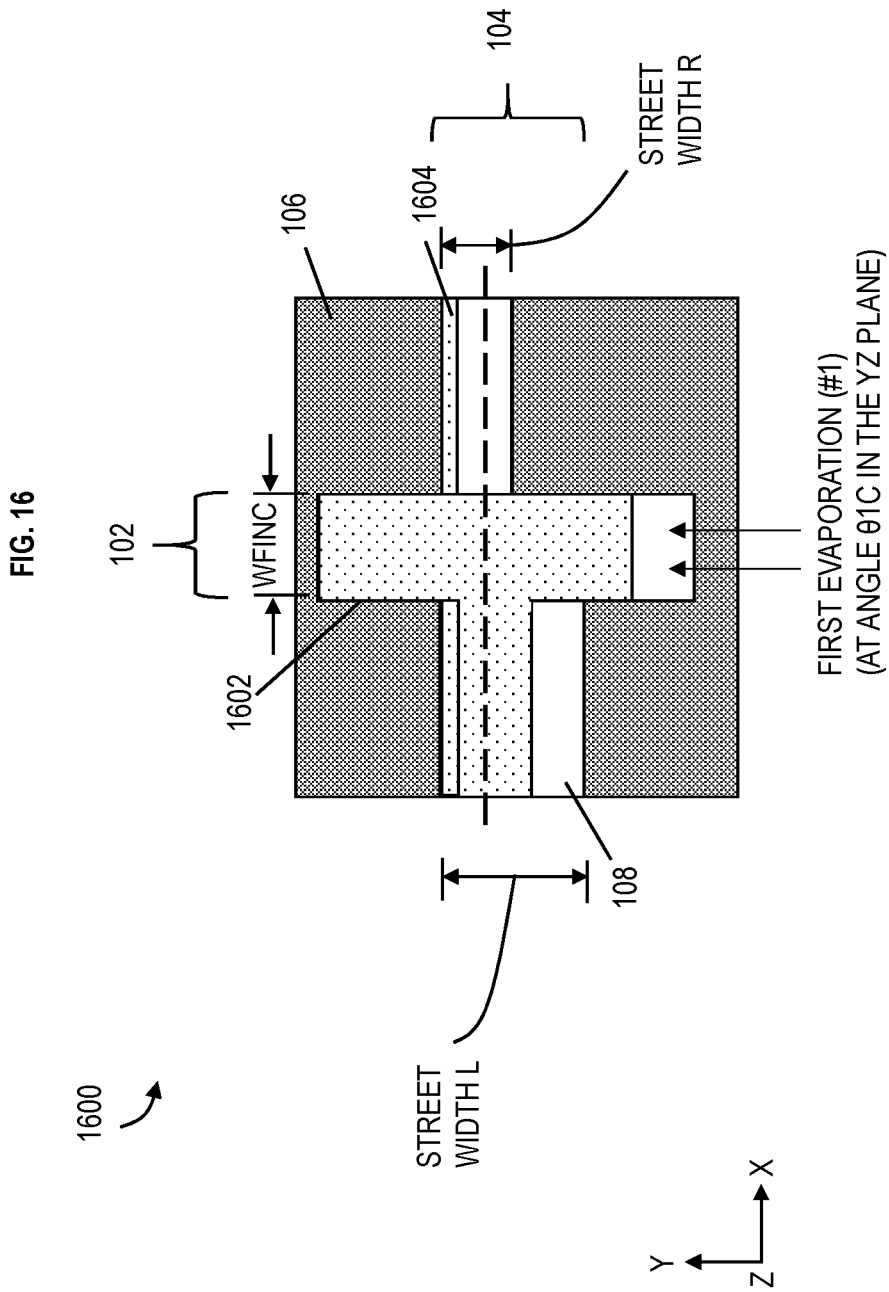
FIG. 16 depicts a top view of fabricating yet another Josephson tunnel junction device according to embodiments of the present invention.

FIGS. 16-21 depict fabrication of a Josephson tunnel junction device 1600 according to embodiments of the present invention. FIG. 16 depicts a top view of fabricating a Josephson tunnel junction 1600 according to embodiments of the present invention. The resist layer 106 is formed in a pattern on the substrate 108, and the resist layer 106 is patterned to have a Manhattan crossing of trenches 102 (i.e., avenue) and 104 (i.e., street) that exposes the substrate 108. In this case, the width of the trench 104 is wider in the y-axis on the left side of the trench 102 than on the right side of the trench 102.

Figure 17:
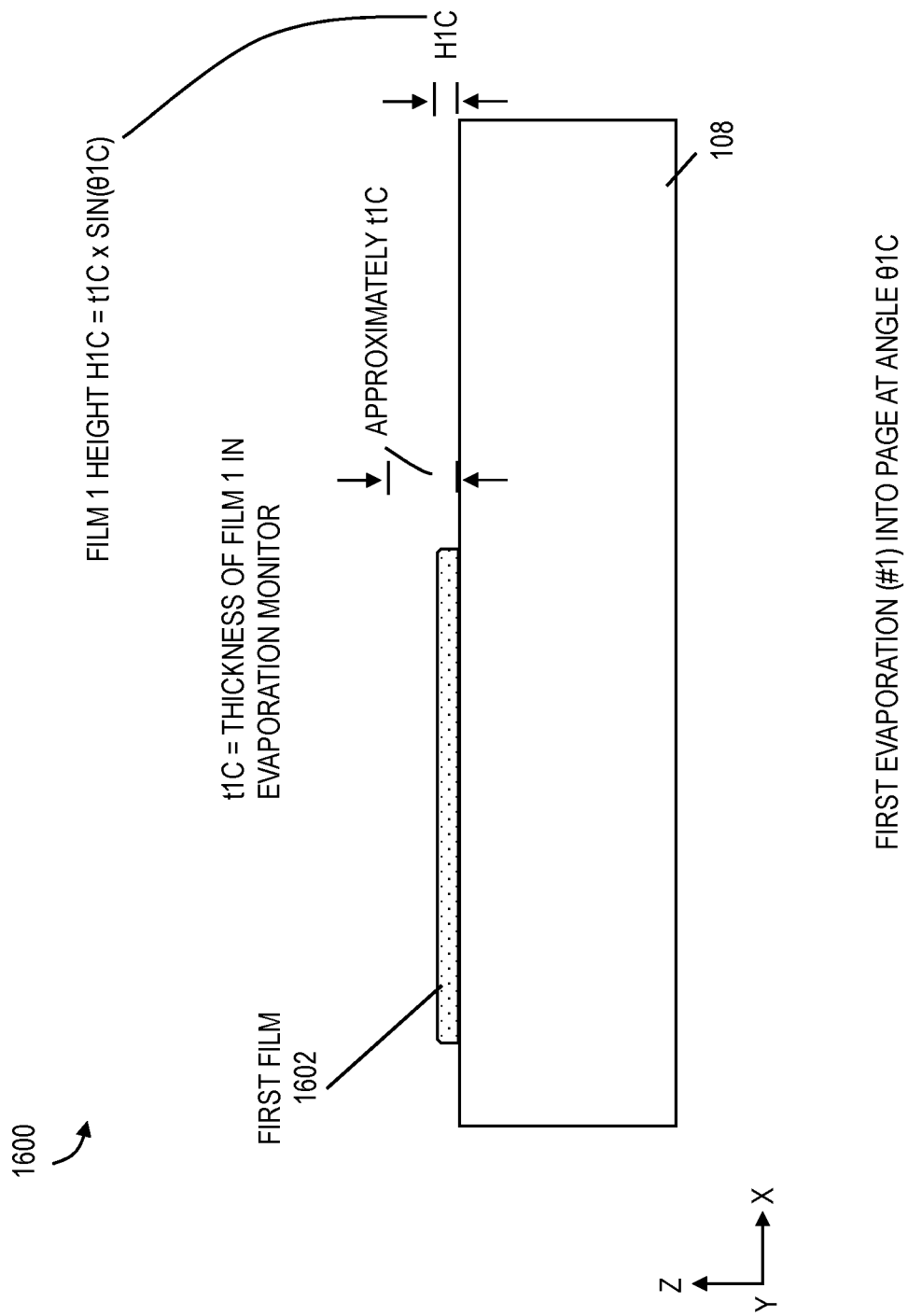
FIG. 17 depicts a cross-sectional view of FIG. 16 according to embodiments of the present invention.

FIG. 16 illustrates the first shadow evaporation (evaporation #1) along the y-axis (i.e., in parallel with the y-axis). FIG. 17 is a cross-sectional view of FIG. 16 according to embodiments of the present invention, taken along the dashed line in FIG. 16. The first shadow evaporation (#1) is configured to form a thin first superconducting film 1602 with height H1C (shown in FIG. 17) and width WfinC. The first superconducting film 1602 is formed in the trench 102 and on a sidewall 1604 of the resist 106 in the trench 104. The sidewall 1604 of the first superconducting film 1602 runs/extends along the x-axis (e.g., has a greater length dimension in the x-axis than dimensions in the y-axis or z-axis) in trench 104 to be perpendicular to the part of the first superconducting film 1602 (running in the y-axis), and it (sidewall 1604) does not make contact to the first superconducting film 1602 because it is attached to resist layer 106 but not to substrate 108 or to first superconducting film 1602. Sidewall deposit 1604 only deposits on the right side of trench 104 and not on the substrate 108 inside the right side of trench 104 because the resist layer 106 creates a shadow over the entire right side of trench 104 over its (narrow) street width R when the first shadow evaporation (#1) has an angle θ1C measured from substrate/wafer 108. Sidewall deposit 1604 deposits on both the left side of trench 104 and on the substrate 108 inside the left side of trench 104 because the resist layer 106 does not create a shadow over the left side of trench 104 over its (wide) street width L when the first shadow evaporation (#1) has the same angle θ1C measured from substrate/wafer 108 (for example, FIG. 33 provides further understanding of this type of evaporation).

The first shadow evaporation (#1) is into the page in FIG. 16 thereby forming the first superconducting film 1602. The first shadow evaporation can be performed at angle θ1C measured from substrate/wafer 108 (or wafer stage holding the substrate 108). The source of the evaporation (evaporator) typically evaporates into the substrate at a 90° angle (at right angle with the substrate 108) relative to the plane of substrate 108. For generating a tilt, the evaporation is performed at a smaller angle to the plane of substrate 108 (or wafer stage holding the substrate 108). In some embodiments of the present invention, the evaporation tilt angle θ1C used to form the first superconducting film 1602 during the first shadow evaporation can range from about 20° to 80°.

The thickness t1C is the thickness of the first superconducting film 1602 in the evaporation monitor. The thickness t1C of the first superconducting film 1602 can range from about 20 nm to 100 nm. The height H1C of the first superconducting film 1602 is $H1C=t1C\times\sin(\theta1C)$. The height H1C of the first superconducting film 1602 in the z-axis can range from about 10 nm to 100 nm. It is noted that the height H1C is a fraction of t1C and will be always smaller, by construction. The thickness t1C (relative to H1C) is shown for explanation purposes and to ease understanding. The width WfinC (in the trench 102) of the first superconducting film 1602 along the x-axis can range from about 20 nm to 200 nm.

Figure 18:
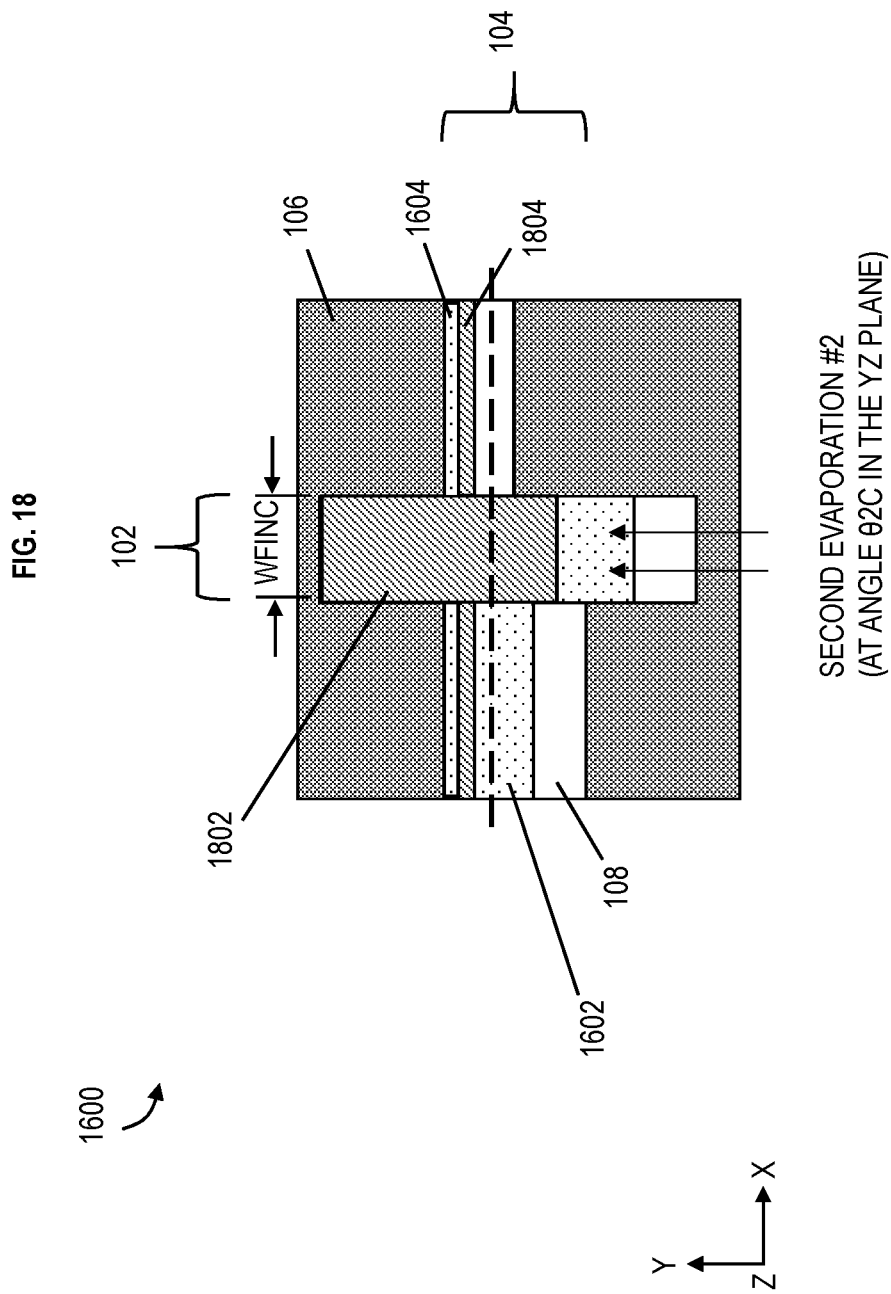
FIG. 18 depicts a top view of fabricating the Josephson tunnel junction device according to embodiments of the present invention.
Figure 19:
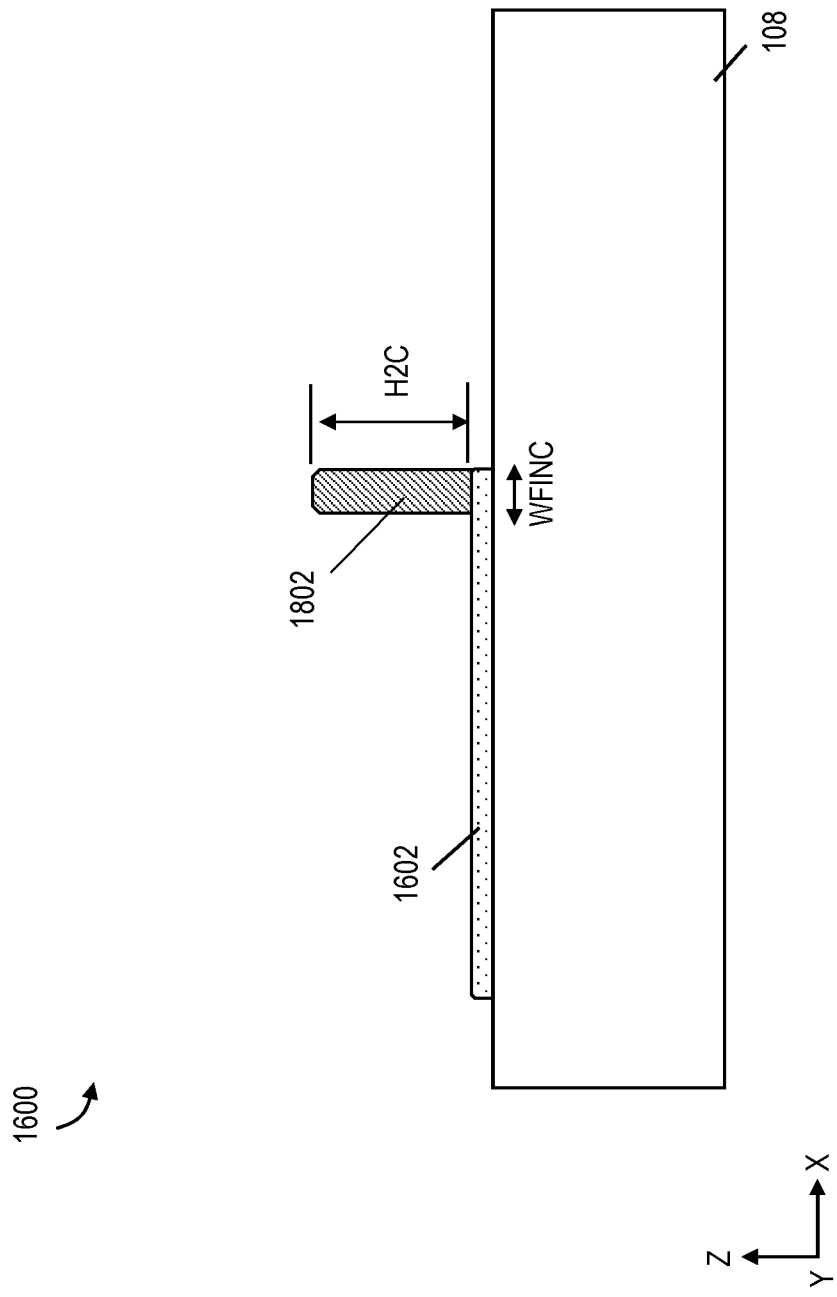
FIG. 19 depicts a cross-sectional view of FIG. 18 according to embodiments of the present invention.

FIG. 18 depicts a top view of fabricating a Josephson tunnel junction 1600 according to embodiments of the present invention. FIG. 19 is a cross-sectional view of FIG. 18 according to embodiments of the present invention, taken along the dashed line in FIG. 18. The second shadow evaporation (evaporation #2) is again along the y-axis (i.e., in parallel with the y-axis), which is like the first shadow evaporation. The second shadow evaporation (#1) is configured to form a tall but narrow second superconducting film 1802 with height H2C (shown in FIG. 19) and width WfinC. The second superconducting film 1802 is formed in the trench 102, and on a sidewall 1804 of the previously formed sidewall 1604 (which in turn is on the sidewall of the resist 106). The sidewall 1804 of the second superconducting film 1802 runs/extends along the x-axis (e.g., has a greater length dimension in the x-axis than dimensions in the y-axis or z-axis) in trench 104 to be perpendicular to the part of the second superconducting film 1802 (running in the y-axis), and not connected to it (because the shadow deposition ends on previous sidewall 1604).

The second shadow evaporation (#2) is also into the page in FIG. 18 thereby forming the second superconducting film 1802. The second shadow evaporation can be a performed at angle θ2C measured from substrate/wafer 108 (or wafer stage holding the substrate 108). Again, the source of the evaporation (evaporator) typically evaporates into the substrate at a 90° angle (at right angle with the substrate 108) relative to the plane of substrate 108. For generating a tilt, the evaporation is performed at a smaller angle to the plane of substrate 108 (or wafer stage holding the substrate 108). In some embodiments of the present invention, the evaporation tilt angle θ2C used to form the second superconducting film 1802 during the second shadow evaporation can range from about 10° to 60°. The angle θ2C has a very shallow tilt angle from the plane of the substrate compared to angle θ1C (i.e., angle θ1C>angle θ2C). For simplicity, the relationship between the heights of the first and second superconducting films 1602 and 1802 can be height H2C>>height H1C.

Figure 20:
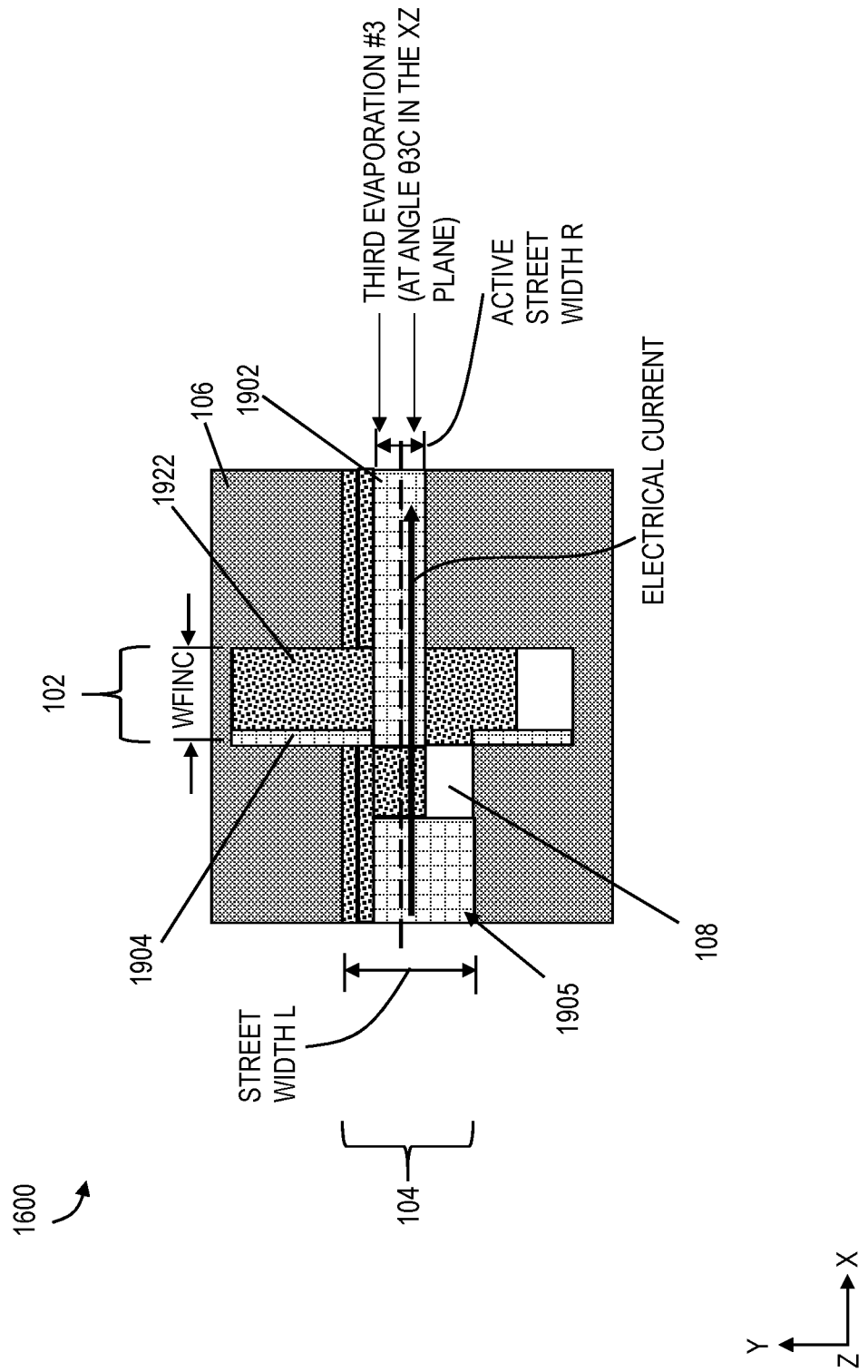
FIG. 20 depicts a top view of fabricating the Josephson tunnel junction device according to embodiments of the present invention.
Figure 21:
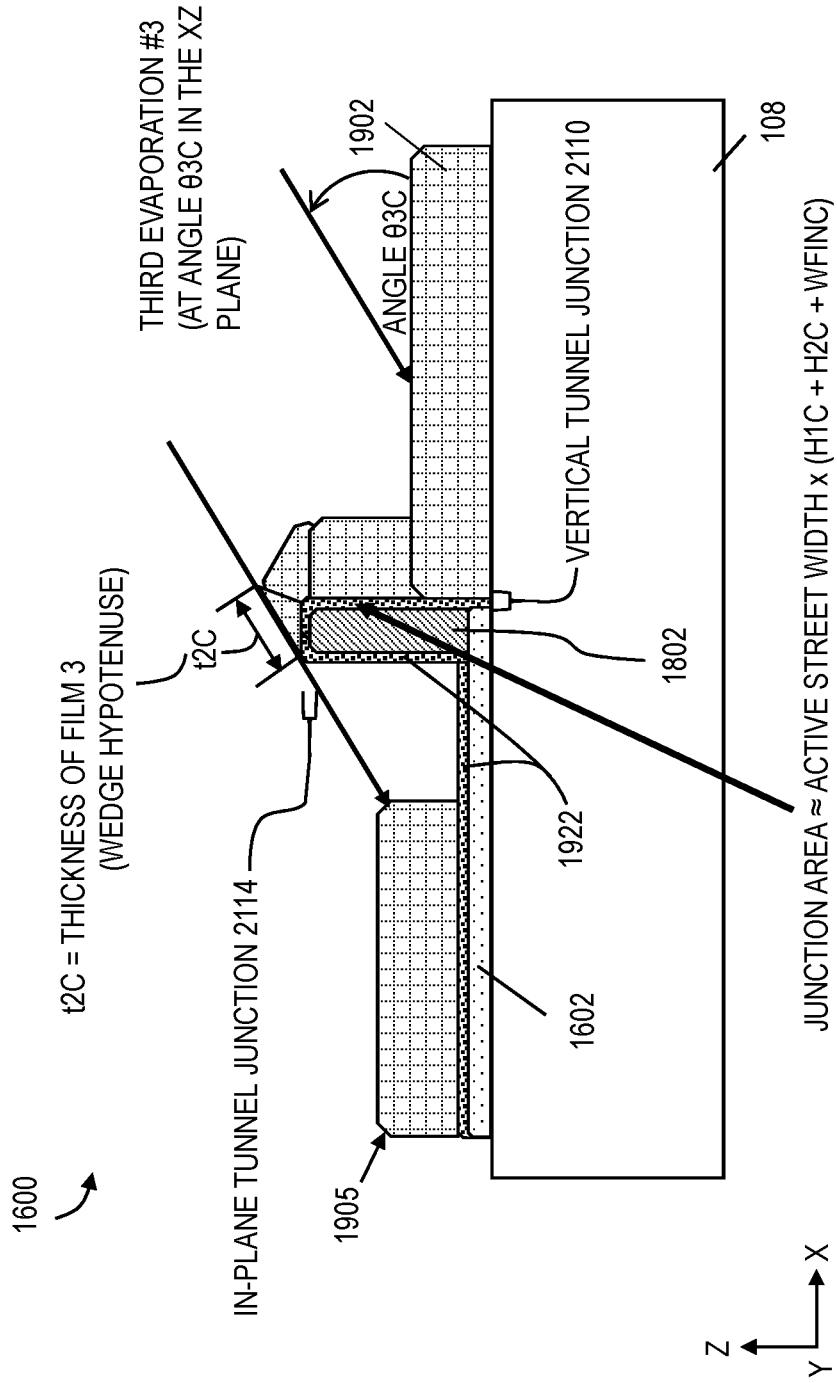
FIG. 21 depicts a cross-sectional view of FIG. 20 according to embodiments of the present invention.

FIG. 20 depicts a top view of fabricating a Josephson tunnel junction 1600 according to embodiments of the present invention. FIG. 21 is a cross-sectional view of FIG. 20 according to embodiments of the present invention, taken along the dashed line in FIG. 20. An oxide layer 1922 is formed on top of the first superconducting film 1602 and second superconducting film 1802 (just as discussed in FIGS. 1-15). The oxide layer 1922 can be the same oxide material as the oxide layer 602 in some embodiments of the present invention. In other embodiments of the present invention, the oxide layer 1922 can be a different oxide material than the oxide layer 602.

After oxidation (or before), the wafer stage is rotated 90° (about its center). Then, the third shadow evaporation (#3) is performed with tilt angle θ3C to deposit a third superconducting film 1902 in the trench 104. The third shadow evaporation is performed from the right with a tilt angle θ3C to deposit the third superconducting film 1902 and results in a patch 1905 of third superconducting film 1902 on the opposite side. The tilt angle θ3C can range from about 20° to 80°. The thickness t2C of the third superconducting film 1902 is the wedge hypotenuse (length). The thickness t2C can range from about 50 nm to 200 nm.

The Josephson tunnel junction device 1600 has an out-of-plane tunnel junction. The out-of-plane tunnel junction includes a vertical tunnel junction 2110, as it relates to the flow of electrical current depicted by the electrical current flow arrow in FIG. 20. The vertical tunnel junction 2110 has a height (in the z-axis) greater than its width in the x-axis as depicted in FIG. 21. As utilized for electrical current flow, the Josephson tunnel junction of the oxide layer 1922 is formed between (right side of) the second superconducting film 1802 and (left side of) the third superconducting film 1902. A very small part of the vertical tunnel junction 2110 is formed between the right side of the first superconducting film 1602 and a small left side of the third superconducting film 1902. Although a small tunnel junction is above the second superconducting film 1802, this tunnel junction does not contribute (or insignificantly adds) to the electrical current flow, as long as height H2C>>fin width WfinC. It is noted that an in-plane tunnel junction 2114 is formed, but the in-plane tunnel junction 2114 does not contribute to and/or marginally contributes to the electrical current flow.

Particularly, the junction area (active street width)× (H1C+H2C+WfinC) as shown in FIGS. 20 and 21. The active street width is the street width R of the right side of trench 104 (i.e., street) along the y-axis minus the combined y-axis widths of sidewall deposits 1604 and 1804 on the right side of 104. The active street width can range from about 20 nm to 200 nm. It is noted that as long as height H2C>>height H1C, the thickness H1C is irrelevant for junction area in this embodiment and can be omitted. It is noted that as long as height H2C>>width WfinC, the width WfinC is irrelevant for junction area in this embodiment and can be omitted.

An arrow illustrating the electrical current flow is shown in FIG. 20 but not in FIG. 21. As an illustration from left to right, the electrical current flows into the left of the first superconducting film 1602, into the second superconducting film 1802, through the vertical tunnel junction 2110 (vertical oxide layer 1922), into the third superconducting film 1902, and out the right side of the third superconducting film 1902.

The first, second, and third superconducting films 1602, 1802, and 1902 can each be the same superconducting material. In some embodiments of the present invention, one or more of the first, second, and third superconducting films 1602, 1802, and 1902 can be different from one another.

There are various options in the fabrication of the Josephson tunnel junction device 1600. In some embodiments of the present invention, the first shadow evaporation (angle θ1C) can be equal to the third shadow evaporation (angle θ3C). It is assumed that the height H2C is much, much greater than the height H1C to arrive at the expression for the junction area (active street width)×(H2C+WfinC).

Figure 22:
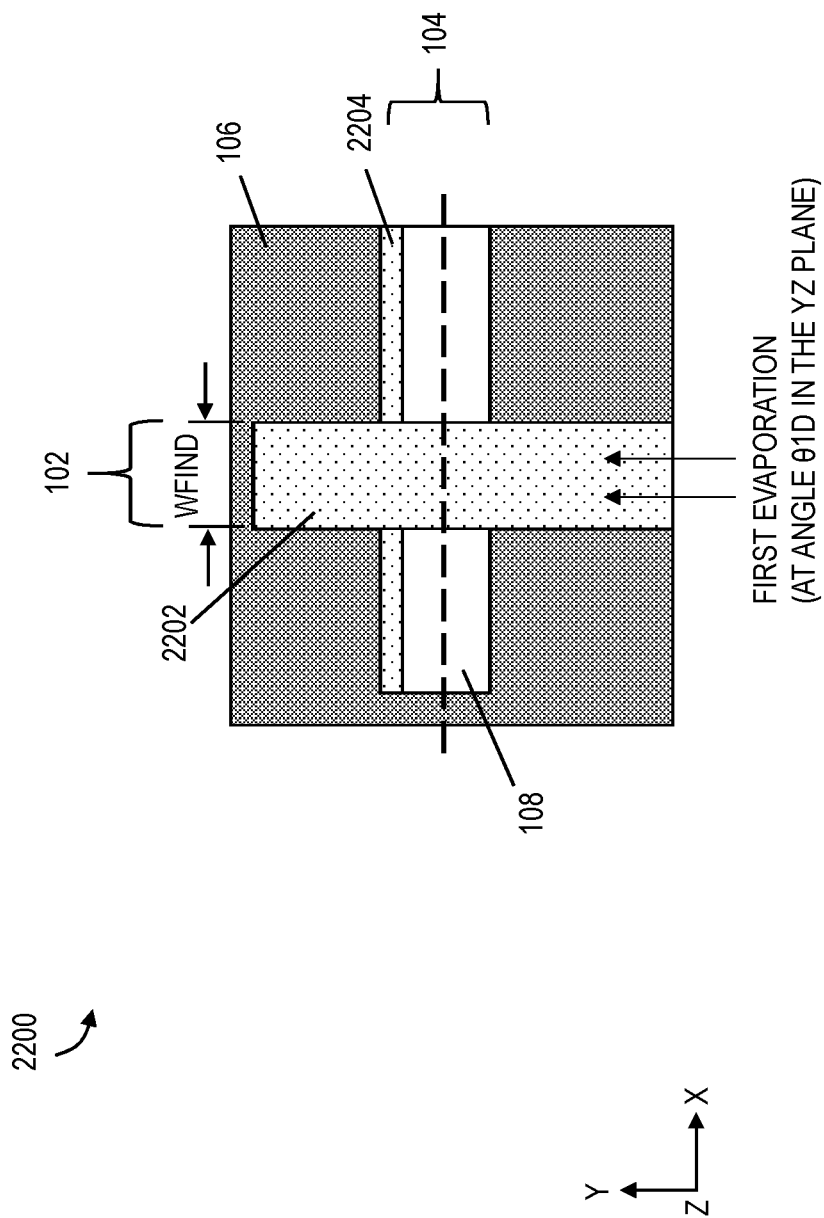
FIG. 22 depicts a top view of fabricating another Josephson tunnel junction device according to embodiments of the present invention.
Figure 23:
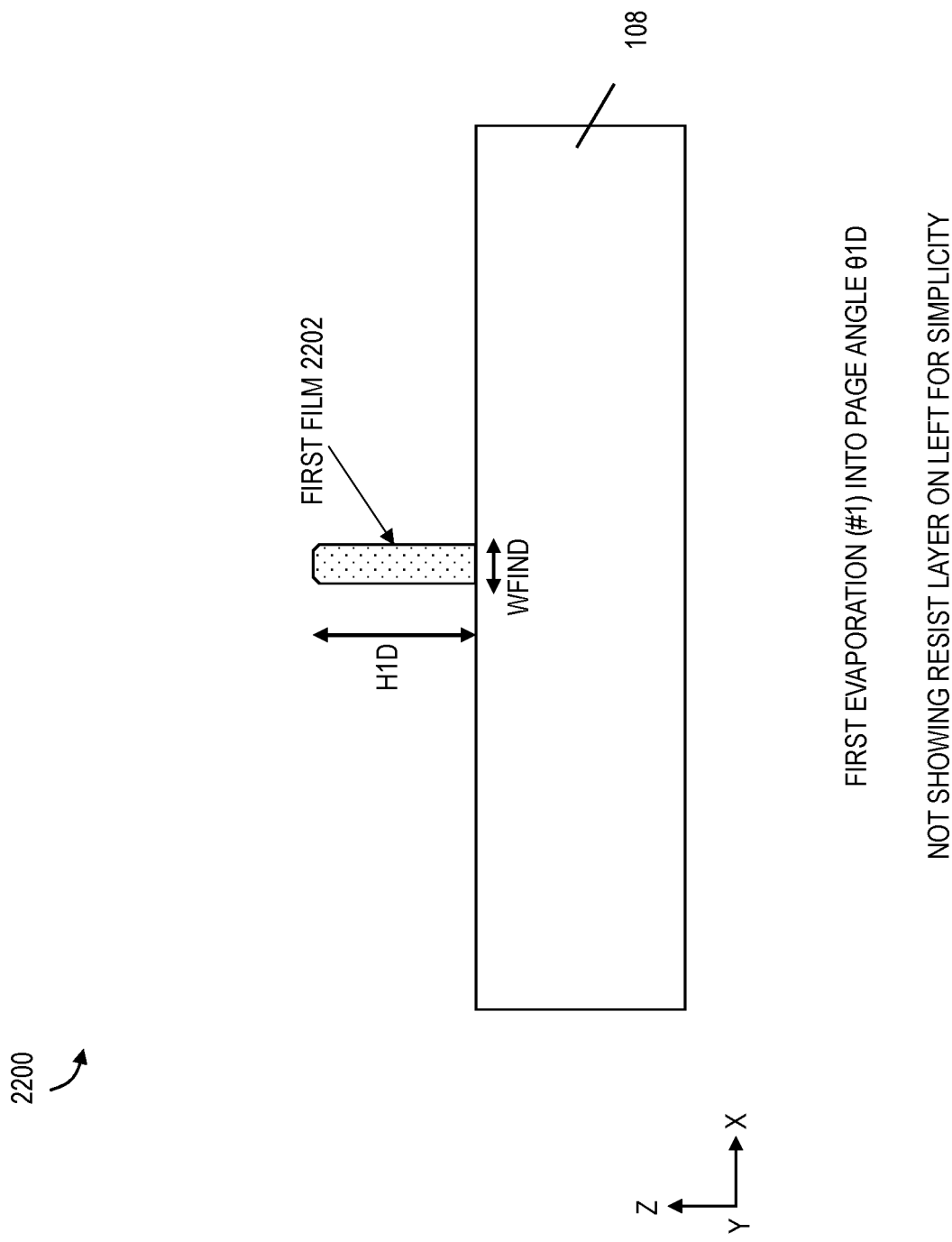
FIG. 23 depicts a cross-sectional view of FIG. 22 according to embodiments of the present invention.
Figure 24:
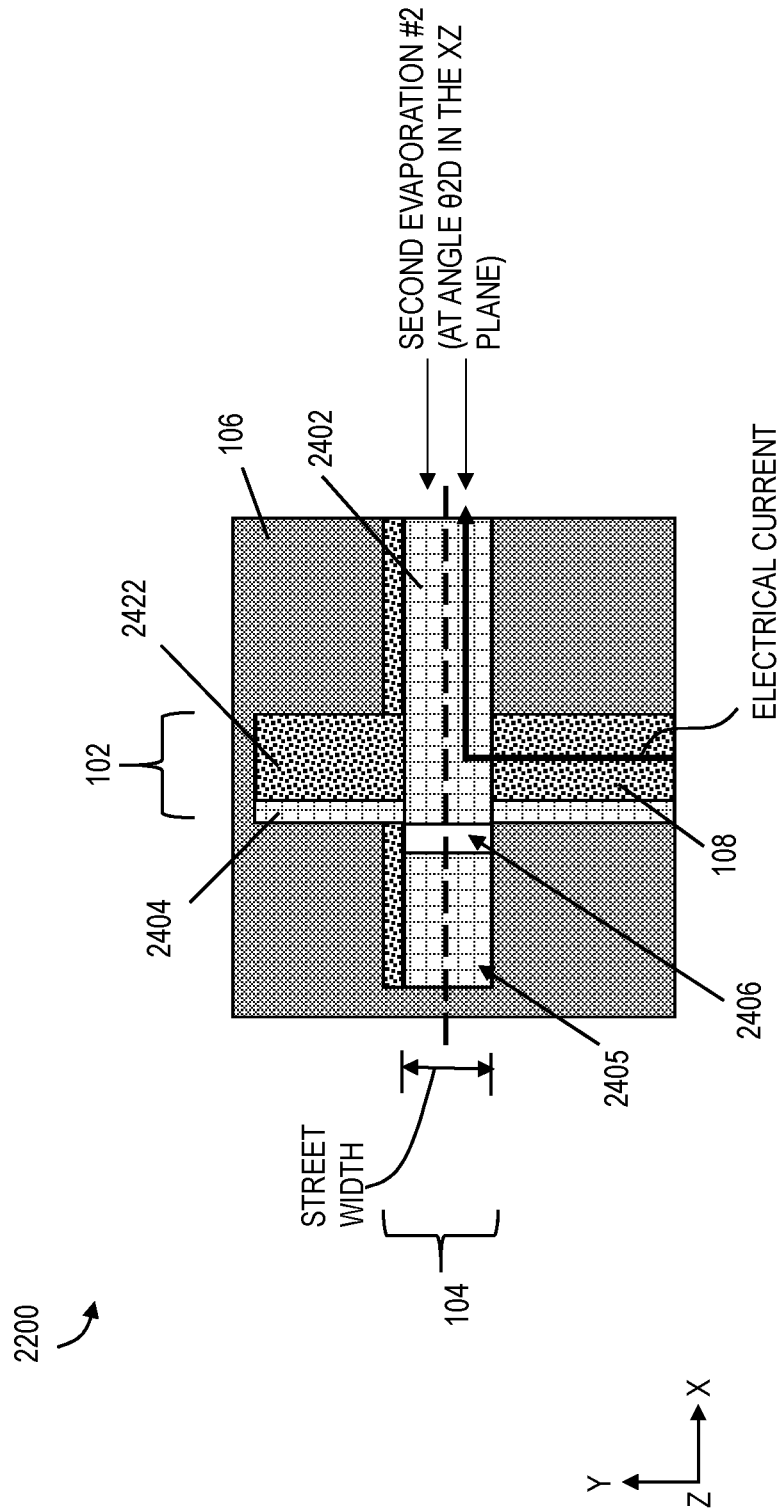
FIG. 24 depicts a top view of fabricating the Josephson tunnel junction device according to embodiments of the present invention.

FIGS. 22-24 depict fabrication of a Josephson tunnel junction device 2200 according to embodiments of the present invention. FIG. 22 depicts a top view of fabricating a Josephson tunnel junction 2200 according to embodiments of the present invention. As discussed above, the resist layer 106 is formed in a pattern on the substrate 108, and the resist layer 106 is patterned to have a Manhattan crossing of trenches 102 and 104 that exposes the substrate 108.

FIG. 22 illustrates the first shadow evaporation (evaporation #1) along the y-axis (i.e., in parallel with the y-axis). FIG. 23 is a cross-sectional view of FIG. 22 according to embodiments of the present invention. The cross-section is taken along the dashed line in FIG. 22. The first shadow evaporation (#1) is configured to form a tall but narrow first superconducting film 2202 with height H1D (shown in FIG. 23) and width WfinD. The height H1D can range from about 30 nm to 300 nm. The width WfinD can range from about 20 nm to 200 nm. The first superconducting film 2202 is formed in the trench 102 and on a sidewall 2204 of the resist 106 in the trench 104. The sidewall 2204 of the first superconducting film 2202 runs/extends along the x-axis (e.g., has a greater length dimension in the x-axis than dimensions in the y-axis or z-axis) in trench 104 to be perpendicular to the part of the first superconducting film 2202 (running in the y-axis), and is not connected to 2202.

The first shadow evaporation (#1) is into the page in FIG. 23 thereby forming the first superconducting film 2202. The first shadow evaporation can be performed at angle θ1D measured from substrate/wafer 108 (or wafer stage holding the substrate 108). The source of the evaporation (evaporator) typically evaporates into the substrate at a 90° angle (at right angle with the substrate 108) relative to the plane of substrate 108. For generating a tilt, the evaporation is performed at a smaller angle to the plane of substrate 108 (or wafer stage holding the substrate 108). In some embodiments of the present invention, the evaporation tilt angle θ1D used to form the first superconducting film 2202 during the first shadow evaporation can range from about 30° to 80°.

Figure 25:
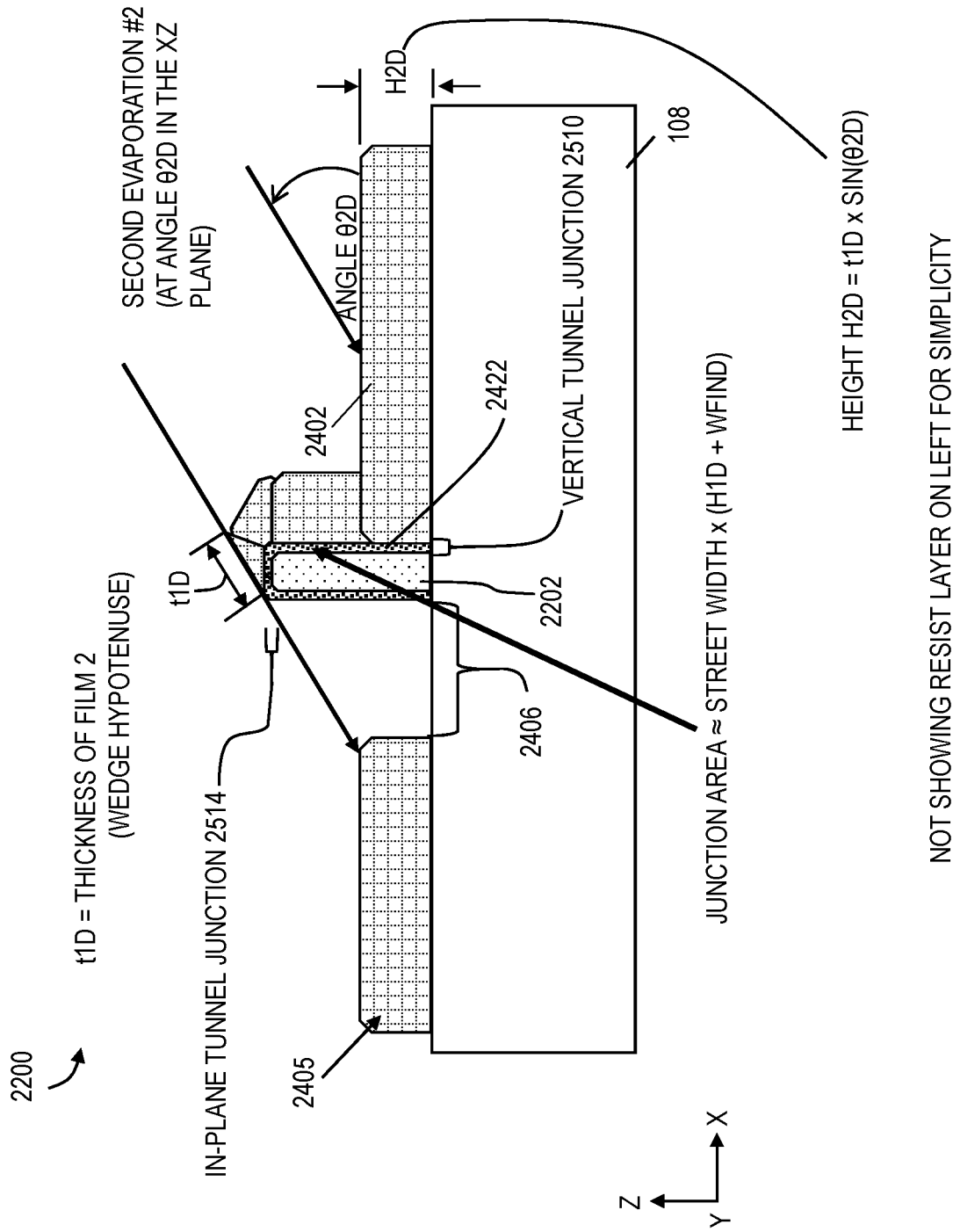
FIG. 25 depicts a cross-sectional view of FIG. 24 according to embodiments of the present invention.

FIG. 24 depicts a top view of fabricating the Josephson tunnel junction device 2200 according to embodiments of the present invention. FIG. 25 depicts a cross-sectional view of FIG. 24 according to embodiments of the present invention. The cross-section is taken along the dashed line in FIG. 24. An oxide layer 2422 is formed on top of the first superconducting film 2202 (just as discussed in FIGS. 1-21). The oxide layer 2422 can be the same oxide material as the oxide layer 602 in some embodiments of the present invention. In other embodiments of the present invention, the oxide layer 2422 can be a different oxide material than the oxide layer 602.

After oxidation (or before), the wafer stage is rotated 90° (about its center). FIG. 24 illustrates rotating the wafer stage 90° (relative to the evaporation source) to perform the second shadow evaporation (evaporation #2). The second shadow evaporation (#2) is from the right and is configured to form a second superconducting film 2402 along with a patch 2405 of second superconducting film 2402. The second superconducting film 2402 is formed in the trench 104 and on a sidewall 2404 of the resist 106 in the trench 102. The sidewall 2404 formed of second superconducting film 2402 runs/extends along the y-axis (e.g., has a greater length dimension in the y-axis than dimensions in the x-axis or z-axis) in trench 102 to be perpendicular to the portion of the second superconducting film 2402 (running in the y-axis), and it is not connected to 2402. The second shadow evaporation creates a gap 2406 on the back side of the first superconducting film 2202 because the gap 2406 is in the (evaporation) shadow of the first superconducting film 2202 relative to the second evaporation angle θ2D.

The second superconducting film 2402 has a thickness t1D and a height H2D. The thickness t1D is greater than or at least approximately equal to width WfinD of the first superconducting film 2202. The thickness t1D is the length of the wedge hypotenuse of the second superconducting film 2402 that extends over the first superconducting film 2202 and over the sidewall 2404. The thickness t1D can range from about 20 nm to 100 nm. The height H2D of the second superconducting film 402 in the z-axis can range from about 10 nm to 100 nm. The height H2D=t1D×sin(θ2D), where angle θ2D is the tilt of the second shadow evaporation from the substrate 108. In some embodiments of the present invention, the evaporation tilt angle θ2D used to form the second superconducting film 2402 during the second shadow evaporation can range from about 20° to 80°.

The Josephson tunnel junction device 2200 has an out-of-plane tunnel junction. The out-of-plane tunnel junction includes a vertical tunnel junction 2510, as it relates to the flow of electrical current depicted by the electrical current flow arrow in FIG. 24. The vertical tunnel junction 2510 has a height (in the z-axis) greater than its width in the x-axis as depicted in FIG. 25. As utilized for electrical current flow, the Josephson tunnel junction of the oxide layer 2422 is formed between (right side of) the first superconducting film 2202 and (left side of) the second superconducting film 2402. Although a small in-plane tunnel junction 2514 is above the first superconducting film 2202, this tunnel junction does not contribute (or insignificantly adds) to the electrical current flow.

Particularly, the junction area (street width)×(H1D+WfinD). The street width is the width of the trench 104 (i.e., street) along the y-axis minus the sidewall deposit 2204 width along the y-axis. The street width includes the first and second superconducting films 2202 and 2402. The street width can range from about 50 nm to 350 nm. It is noted that as long as height H1D>>width WfinD, the width WfinD is irrelevant for junction area determination in this embodiment and can be omitted.

An arrow illustrating the electrical current flow is shown in FIG. 24 but not in FIG. 25. It is noted that the first superconducting film 2202 extends in and out of the page in FIG. 25. As an illustration of electrical current flow, the electrical current flows into the first superconducting film 2202 by flowing into the page in the y-axis (in FIG. 25), flows through the vertical tunnel junction 2510 (vertical oxide layer 2422) by flowing in the right direction along the x-axis, into the second superconducting film 2402, and out the right side of the second superconducting film 2402.

The first and second superconducting films 2202 and 2402 can each be the same superconducting material. In some embodiments of the present invention, one or more of the first and second superconducting films 2202 and 2402 can be different from one another.

There are various options in the fabrication of the Josephson tunnel junction device 2200. In some embodiments of the present invention, the first shadow evaporation (angle θ1D) can be equal to the second shadow evaporation (angle θ2D). It is noted that this is a 90° Josephson junction, meaning that the current path across the Josephson junction makes a 90° turn in the top view (FIG. 24).

Figure 26:
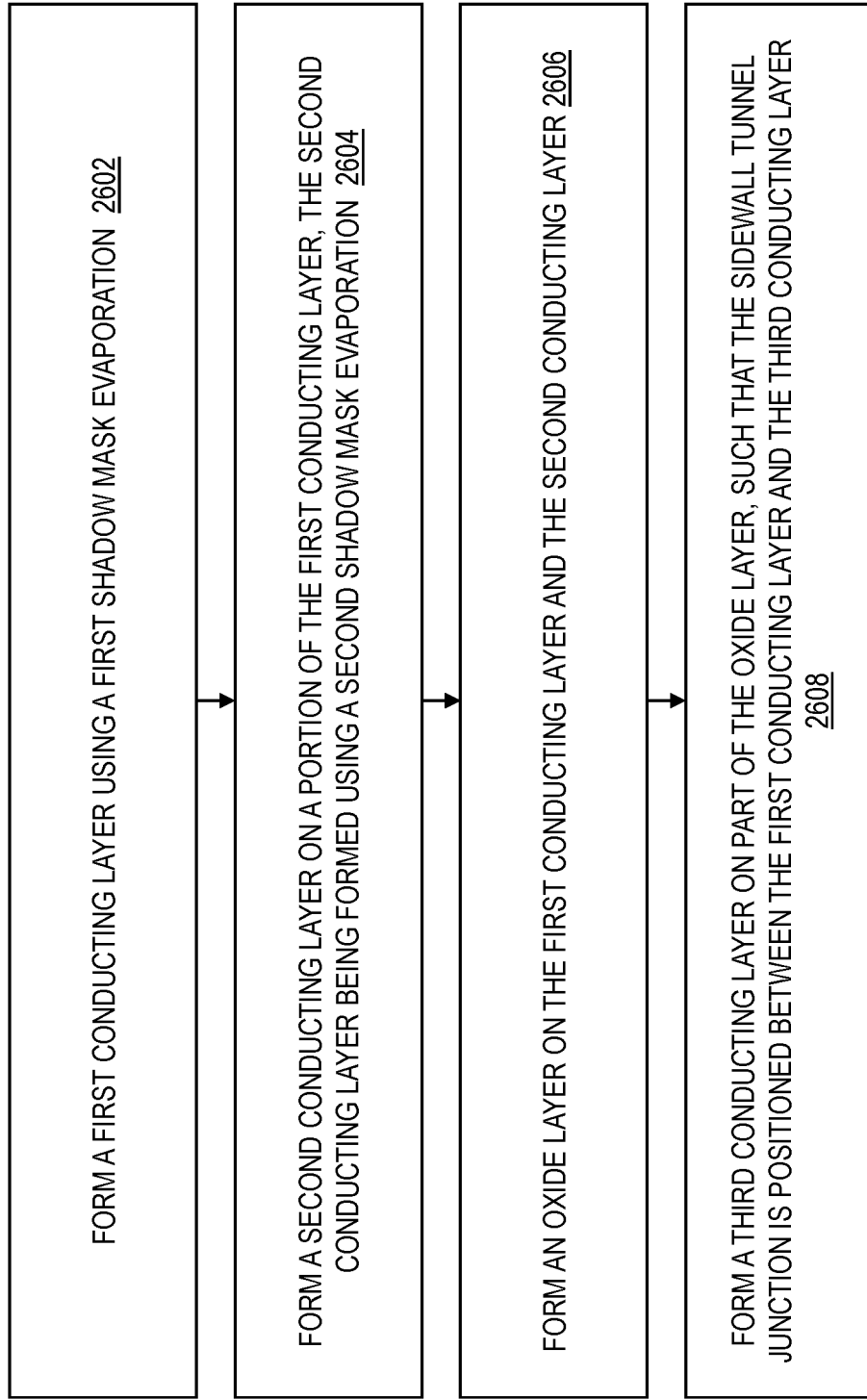
FIG. 26 depicts a flow chart of a method of forming a sidewall tunnel junction of an out-of-plane Josephson junction device according to embodiments of the present invention.

FIG. 26 depicts a flow chart 2600 of a method of forming a sidewall tunnel junction of an out-of-plane Josephson junction device 100 according to embodiments of the present invention. At block 2602, a first conducting layer 202 is formed using a first shadow mask evaporation (at angle θ1A). At block 2604, a second conducting layer 402 is formed on a portion of the first conducting layer 202, where the second conducting layer 402 is formed using a second shadow mask evaporation (at angle θ2A). At block 2606, an oxide layer 602 is formed on the first conducting layer 202 and the second conducting layer 402. At block 2608, a third conducting layer 802 is formed on a region of the oxide layer 602, such that the sidewall tunnel junction (e.g., vertical tunnel junction 910) is positioned between the first conducting layer 202 and the third conducting layer 802.

A segment of the sidewall tunnel junction (e.g., angled tunnel junction 912) is positioned between the second conducting layer 402 (e.g., triangular portion of second conducting layer 402 above vertical portion of second conducting layer 402 and above first conducting layer 202 in FIG. 9) and the third conducting layer (e.g., triangular portion of third conducting layer 802 above vertical portion of second conducting layer 402 and above first conducting layer 202 in FIG. 9). The segment of the sidewall tunnel junction is above the first conducting layer. The first, second, and third conducting layers 202, 402, 802 are superconducting materials. The oxide layer 602 is an oxide of the first and second conducting layers 202, 402.

Figure 27:
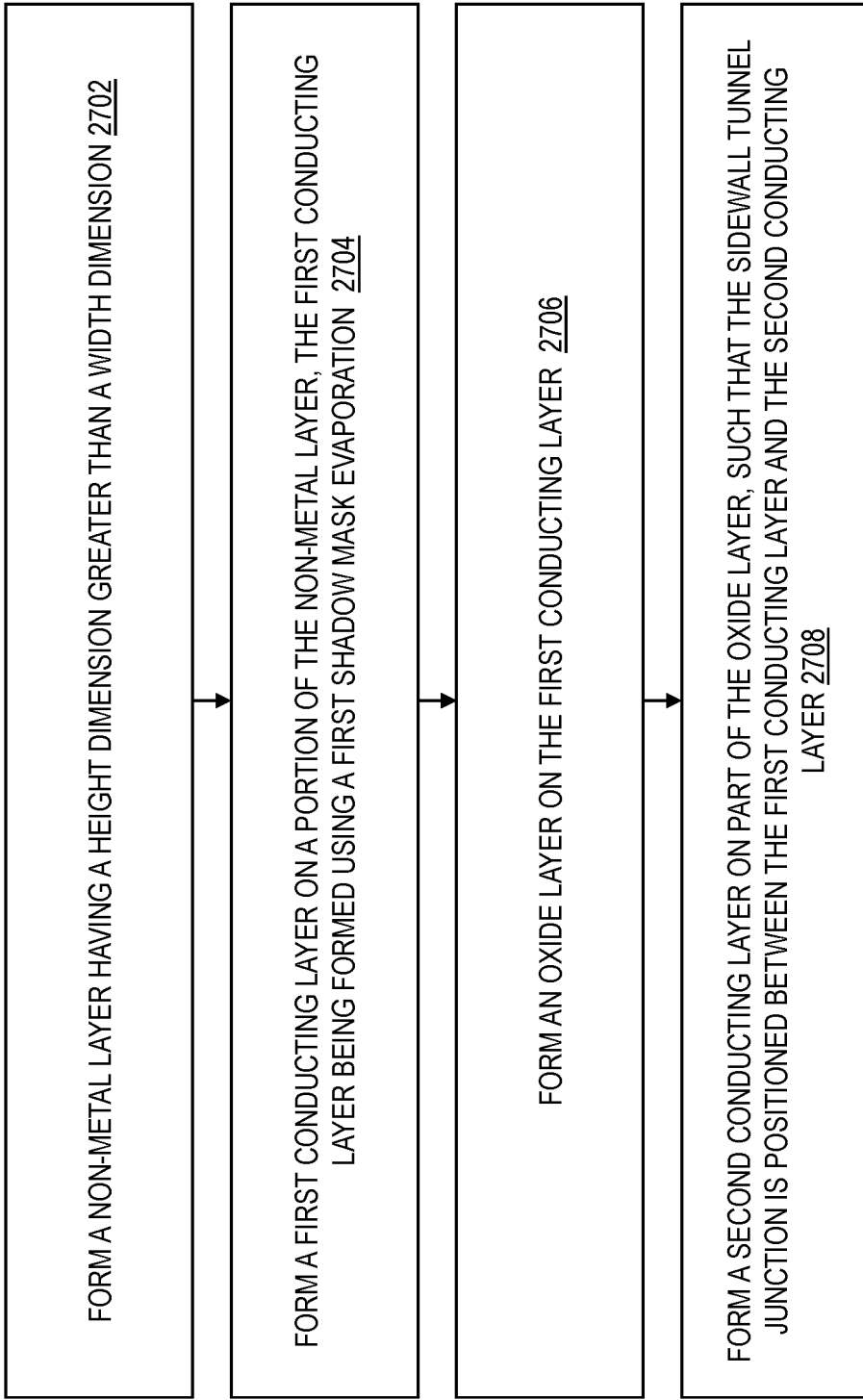
FIG. 27 depicts a flow chart of a method of forming a sidewall tunnel junction of an out-of-plane Josephson junction device according to embodiments of the present invention.

FIG. 27 depicts a flow chart 2700 of a method of forming a sidewall tunnel junction of an out-of-plane Josephson junction device 1000 according to embodiments of the present invention. At block 2702, a non-metal layer 1002 (i.e., step edge) is formed with a height dimension (e.g., in the z-axis) greater than a width dimension (e.g., in the x-axis). At block 2704, a first conducting layer 1202 is formed on a portion of the non-metal layer 1002, where the first conducting layer 1202 is formed using a first shadow mask evaporation (e.g., at angle θ1B). At block 2706, an oxide layer 1404 is formed on the first conducting layer 1202. At block 2708, a second conducting layer 1402 is formed on part of the oxide layer 1404, such that the sidewall tunnel junction (e.g., out-of-plane angled tunnel junction 1512) is positioned between the first conducting layer 1202 and the second conducting layer 1402.

The sidewall tunnel junction (e.g., out-of-plane angled tunnel junction 1512) is above the non-metal layer 1002 in FIG. 15. The first conducting layer 1202 is formed on one side (e.g., the left side in FIGS. 13 and 15) of the non-metal layer 1002. The second conducting layer 1402 is formed on another side (e.g., the right side in FIG. 15) of the non-metal layer opposite the first conducting layer. The first and second conducting layers are superconducting materials.

FIG. 28 depicts a flow chart 2800 of a method of forming a sidewall tunnel junction of an out-of-plane Josephson junction device 1600 according to embodiments of the present invention. At block 2802, a first conducting layer 1602 is formed using a first shadow mask evaporation (e.g., at angle θ1C), where the first conducting layer 1602 has a width dimension (e.g., in the x-axis) greater than a height dimension (e.g., in the z-axis). At block 2804, a second conducting layer 1802 is formed on top of a portion of the first conducting layer 1602, where the second conducting layer 1802 is formed using a second shadow mask evaporation (e.g., at angle θ2C). At block 2806, an oxide layer 1922 is formed on the first conducting layer 1602 and the second conducting layer 1802, where a part (e.g., the bottom right portion in FIG. 21) of the first conducting layer 1602 is underneath the second conducting layer 1802. At block 2808, a third conducting layer 1902 is formed on part of the oxide layer 1922, such that the sidewall tunnel junction (e.g., vertical tunnel junction 2110) is positioned between the second conducting layer 1802 and the third conducting layer 1902, where the sidewall tunnel junction (e.g., bottom portion of vertical tunnel junction 2110 in FIG. 21) is also positioned between the part of the first conducting layer 1602 and (a bottom portion in FIG. 21) the third conducting layer 1902.

A top portion of the second conducting layer 1802 is covered by the oxide layer 1922, such that an in-plane tunnel junction 2114 is also positioned between the third conducting layer 1902 and the top portion of the second conducting layer 1802. The oxide layer 1922 covers a side portion (e.g., left side) of the second conducting layer 1802, and the side portion is opposite the sidewall tunnel junction (e.g., opposite the vertical tunnel junction 2110). The first, second, and third conducting layers 1602, 1802, 1902 are superconducting materials.

FIG. 29 depicts a flow chart 2900 of a method of forming a sidewall tunnel junction of an out-of-plane Josephson junction device 2200 according to embodiments of the present invention. At block 2902, a first conducting layer 2202 is formed using a first shadow mask evaporation (at angle θ1D), where the first conducting layer 2202 has a height dimension (e.g., in the z-axis in FIG. 23) greater than a width dimension (e.g., in the x-axis in FIG. 23). At block 2904, an oxide layer 2422 is formed on the first conducting layer 2202. At block 2906, a second conducting layer 2402 on the oxide layer 2422 covering a top portion (to form an in-plane tunnel junction 2514) and a side portion of the first conducting layer 2202, such that the sidewall tunnel junction (e.g., the vertical tunnel junction 2510) is positioned between the second conducting layer 2402 and the top and side portions of the first conducting layer 2202. The second conducting layer 2402 is formed by a second shadow mask evaporation (at angle θ2D).

The oxide layer 2422 covers another side portion of the first conducting layer 2202, where the another side portion (e.g., left side of the first conducting layer 2202) being opposite the side portion (e.g., right side). The second conducting layer 2402 is absent from the oxide layer 2422 covering the another side portion (e.g., left side of the first conducting layer 2202) of the first conducting layer 2202. A portion (e.g., on the left side in FIG. 25) of the second conducting layer 2402 is spaced apart from the first conducting layer 2202. Additionally, an embodiment of the invention can be engineered without this "patch" existing. The resist on the left side of the street can be made closer to the avenue, and then this portion lands on the resist and is lifted off at the end.

The first and second conducting layers 2202, 2402 are superconducting materials. The first and second conducting layers 2202, 2402 can be the same material or different materials. The oxide layer 2422 is an oxide of the first conducting layer 2202.

Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. Any transmission lines (i.e., wires) connecting the various elements are made of a superconducting material.

Figure 30:
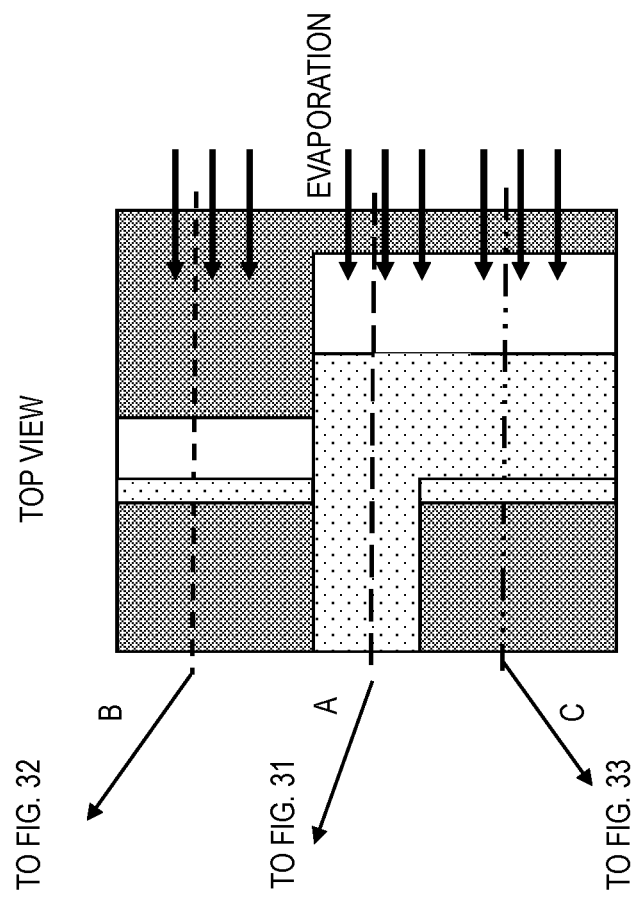
FIG. 30 is a top view depicting concepts according to embodiments of the present invention.

FIG. 30 is a top view depicting concepts according to embodiments of the present invention. FIG. 31 is a cross-sectional view taken from FIG. 30 to illustrate concepts according to embodiments of the present invention. FIG. 32 is a cross-sectional view taken from FIG. 30 to illustrate concepts according to embodiments of the present invention. FIG. 33 is a cross-sectional view taken from FIG. 30 to illustrate concepts according to embodiments of the present invention. FIGS. 30, 31, 32 and 33 depict an example of how shadow evaporation can work. For example, FIG. 31 illustrates when a shadow makes the evaporation (material) land on the substrate (deposited film), while FIG. 32 illustrates when a shadow makes the evaporation (material) land only on the resist (sidewall deposit and top deposit). Finally, FIG. 33 illustrates when a shadow makes the evaporation (material) land partially on the substrate (deposited film), and partially on the resist (sidewall deposit and top deposit). In FIG. 33, some of the evaporation (material) lands in the region between the top resist layer and the substrate. This region can be created using a bottom resist layer with undercut, as understood by one skilled in the art. The evaporation (material) that lands on the top resist layer in FIGS. 31, 32 and 33 is not shown in the top view of FIG. 30 for simplicity. The sidewall deposit of FIGS. 32 and 33 lands only on the top resist and not on the substrate, and it is not connected to any deposited film that lands directly on the substrate.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist (and/or alternatively by e-beam resist in e-beam lithography). To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A tunnel junction device comprising a Josephson tunnel junction device, the tunnel junction device comprising:
    a first conducting layer having a height dimension greater than a width dimension;
    an oxide layer formed on the first conducting layer; and
    a second conducting layer formed on the oxide layer covering a top surface and a side portion of the first conducting layer, such that an angled portion of the second conducting layer is positioned on the top surface of the first conducting layer, the angled portion having a surface that is neither parallel nor perpendicular to the top surface, a third conducting layer interposed between the angled portion of the second conducting layer and the top surface of the first conducting layer.

2. The tunnel junction device of claim 1, wherein the oxide layer covers another side portion of the first conducting layer.

3. The tunnel junction device of claim 2, wherein the another side portion is opposite the side portion.

4. The tunnel junction device of claim 1, wherein the second conducting layer is absent from the oxide layer covering another side portion of the first conducting layer.

5. The tunnel junction device of claim 1, wherein the first and second conducting layers comprise a same material.

6. The tunnel junction device of claim 1, wherein the first and second conducting layers are superconducting materials.

7. The tunnel junction device of claim 1, wherein the oxide layer is an oxide of the first conducting layer.

8. The tunnel junction device of claim 1, wherein the first conducting layer is on a substrate.

9. The tunnel junction device of claim 1, wherein the oxide layer is on a substrate.

10. The tunnel junction device of claim 1, wherein the second conducting layer is on a substrate.

11. The tunnel junction device of claim 1, wherein the height dimension is substantially perpendicular to the width dimension.

12. The tunnel junction device of claim 1, wherein a vertical tunnel junction is formed between the first conducting layer and the second conducting layer.

13. The tunnel junction device of claim 12, wherein the side portion of the first conducting layer is used to form the vertical tunnel junction.

14. The tunnel junction device of claim 12, wherein a width and a height of the vertical tunnel junction are different.

15. The tunnel junction device of claim 12, wherein a height of the vertical tunnel junction is greater than a width of the vertical tunnel junction.

* * * * *